(12) United States Patent
Ikemoto et al.

(10) Patent No.: US 9,167,685 B2
(45) Date of Patent: Oct. 20, 2015

(54) CIRCUIT BOARD

(71) Applicant: Murata Manufacturing Co., Ltd., Nagaokakyo-shi, Kyoto-fu (JP)

(72) Inventors: Nobuo Ikemoto, Nagaokakyo (JP); Yuki Wakabayashi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/634,982

(22) Filed: Mar. 2, 2015

(65) Prior Publication Data
US 2015/0181699 A1 Jun. 25, 2015

Related U.S. Application Data

(63) Continuation of application No. PCT/JP2013/083592, filed on Dec. 16, 2013.

(30) Foreign Application Priority Data

Dec. 29, 2012 (JP) ................................. 2012-289205

(51) Int. Cl.
| H05K 1/00 | (2006.01) |
| H05K 1/02 | (2006.01) |
| H05K 3/46 | (2006.01) |
| H05K 1/11 | (2006.01) |

(52) U.S. Cl.
CPC .............. H05K 1/0281 (2013.01); H05K 1/115 (2013.01); H05K 3/4691 (2013.01)

(58) Field of Classification Search
CPC ..... H05K 1/0393; H05K 1/118; H05K 1/028; H05K 1/0281; H05K 1/189; H05K 1/147; H05K 2201/2009; H05K 1/115; H05K 3/4691

USPC .......................................... 174/254; 361/749
See application file for complete search history.

(56) References Cited

U.S. PATENT DOCUMENTS

| 4,908,039 | A | * | 3/1990 | Holland et al. ..................... 8/137 |
| 5,516,989 | A | * | 5/1996 | Uedo et al. ...................... 174/254 |
| 6,104,464 | A | * | 8/2000 | Adachi et al. .................. 349/150 |
| 8,119,924 | B2 | * | 2/2012 | Abe et al. ........................ 174/258 |
| 2012/0230000 | A1 | * | 9/2012 | Ishino et al. .................. 361/803 |
| 2014/0368782 | A1 | * | 12/2014 | Kim et al. ...................... 349/153 |

FOREIGN PATENT DOCUMENTS

| JP | 63-265494 A | 11/1988 |
| JP | 2002-305382 A | 10/2002 |
| JP | 2010-040934 A | 2/2010 |

OTHER PUBLICATIONS

Official Communication issued in International Patent Application No. PCT/JP2013/083592, mailed on Mar. 11, 2014.

* cited by examiner

*Primary Examiner* — Hoa C Nguyen
(74) *Attorney, Agent, or Firm* — Keating & Bennett, LLP

(57) ABSTRACT

A circuit board includes a plate-shaped dielectric body with a first and a second main surface and including a first area not to be bent and a second area to be bent such that the first main surface becomes an outer side, a first reinforcing member located in the first area nearer the first main surface in relation to a center of the second area in a thickness direction and away from the second area, and a second reinforcing member located in the first area nearer the second main surface in relation to the center of the second area and contacting with a border between the first and the second areas. The first main surface curves from an edge of the first reinforcing member closest to the second area, and the second main surface curves from an edge of the second reinforcing member on the border.

14 Claims, 27 Drawing Sheets

F I G. 1A
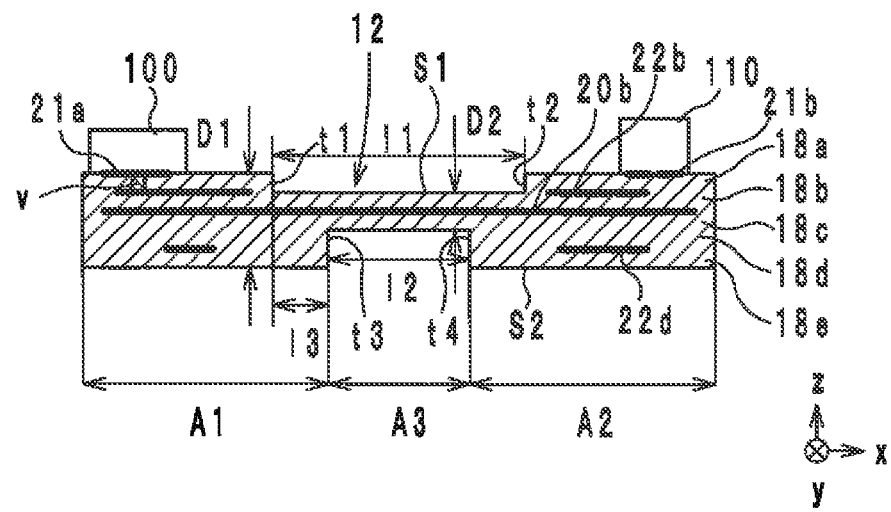
F I G. 1B
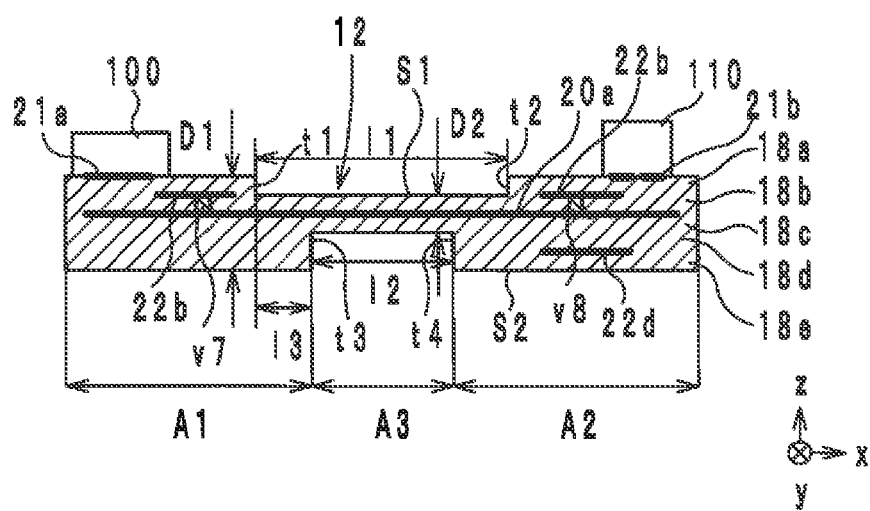

FIG. 4
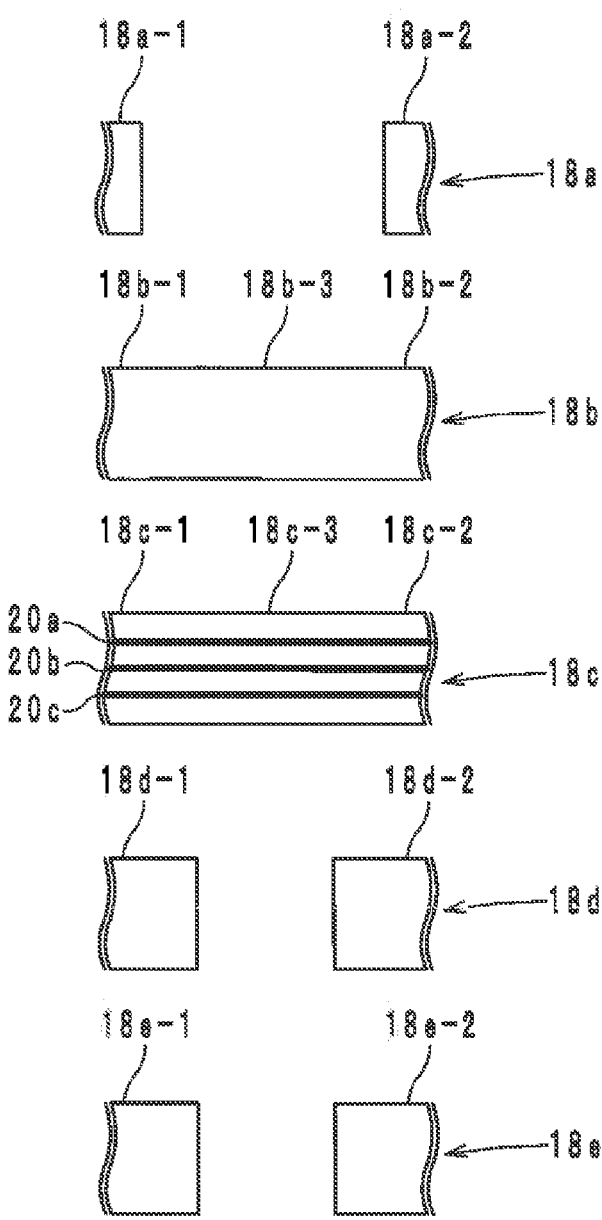
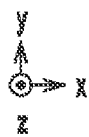

FIG. 11
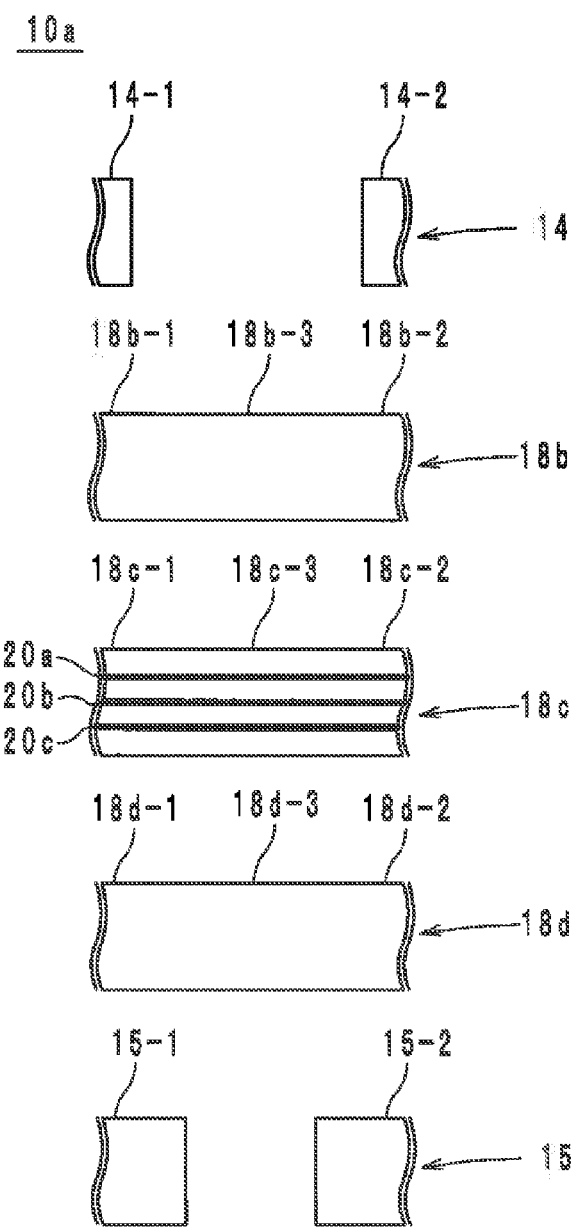
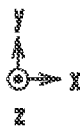

FIG. 21
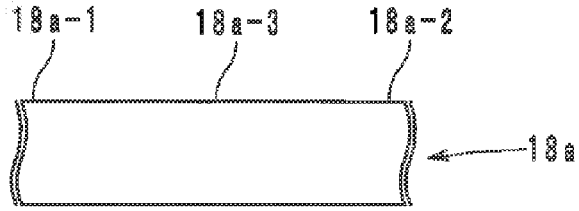
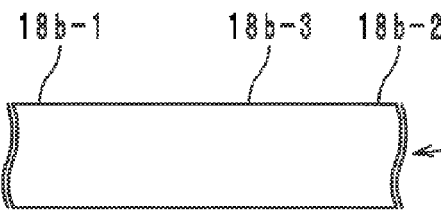
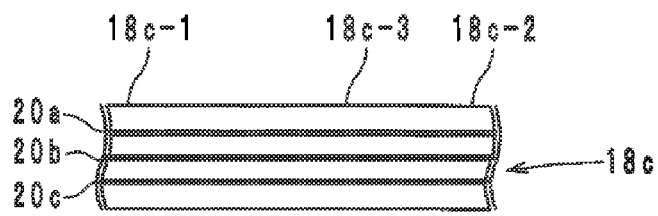
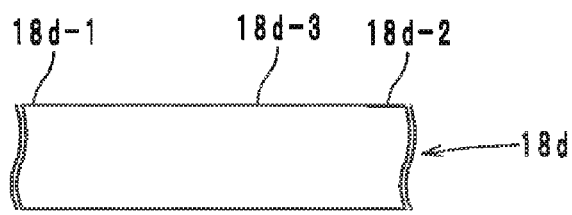
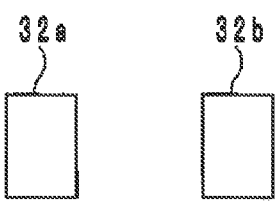
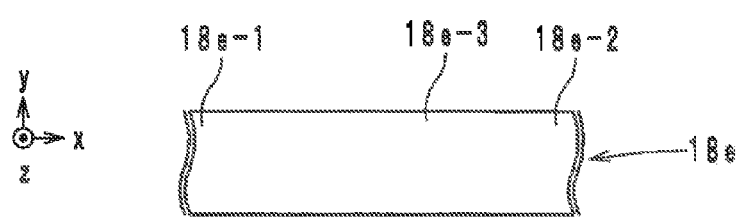

F I G . 2 4
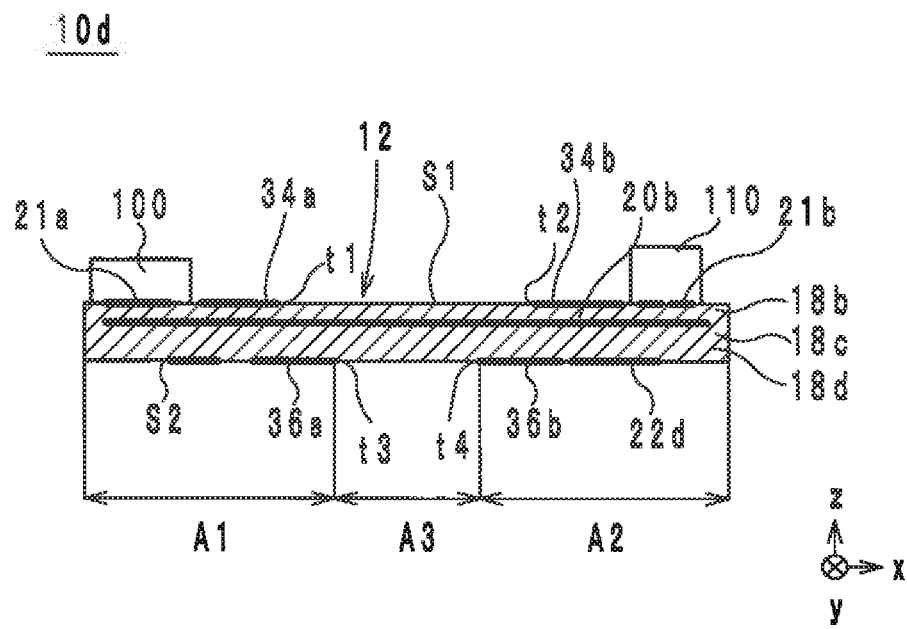
F I G . 2 5
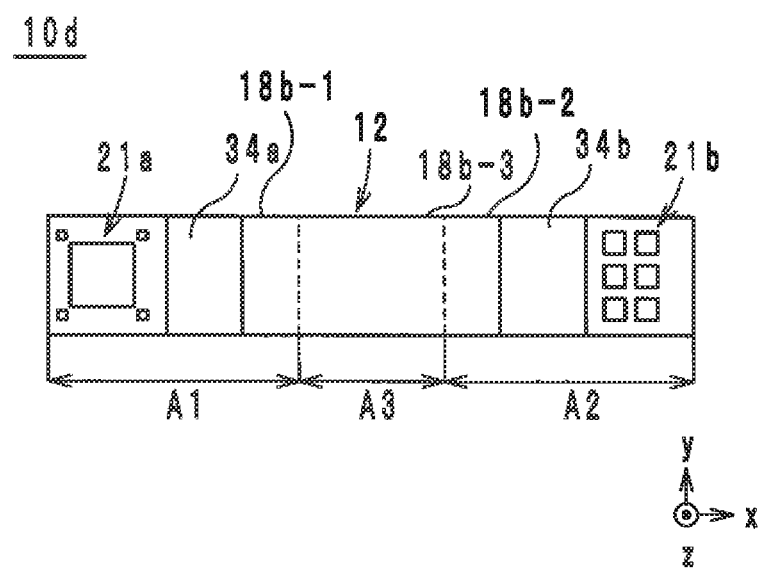

FIG. 37A
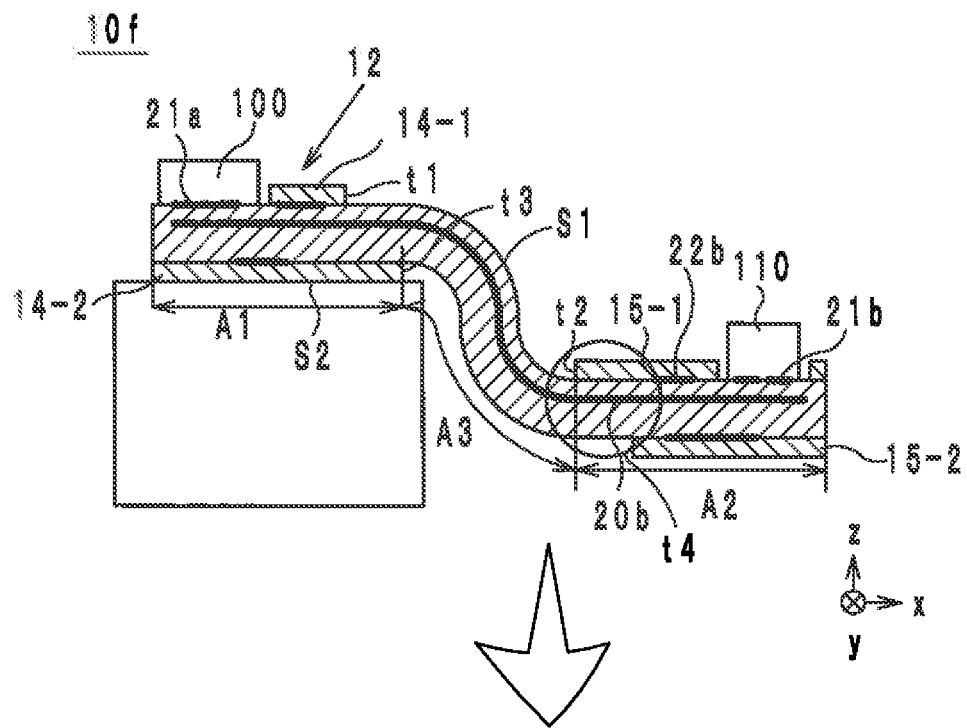
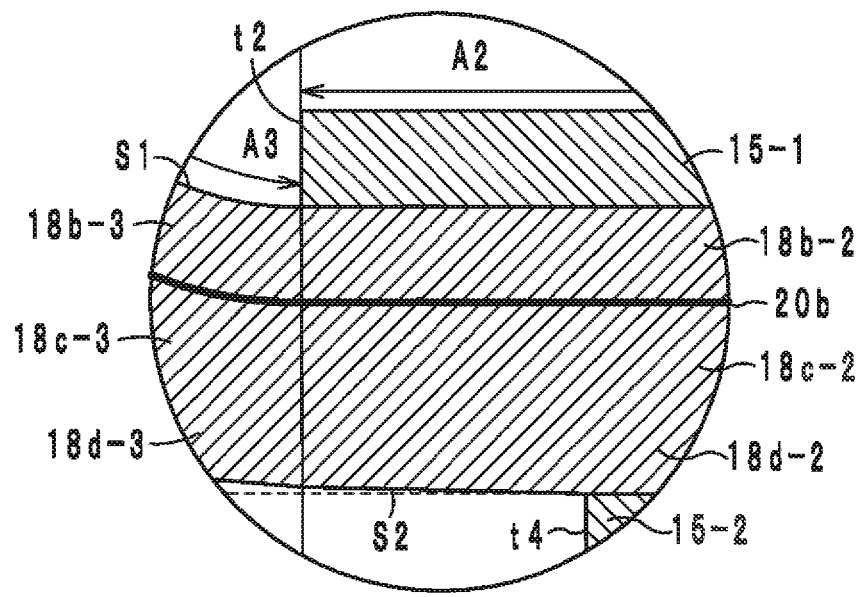

CIRCUIT BOARD

BACKGROUND OF THE INVENTION

1. Field of the Invention

The present invention relates to a circuit board, and more particularly to a circuit board that is bent when used.

2. Description of the Related Art

As a conventional circuit board, for example, a printed circuit board disclosed in Japanese Patent Laid-Open Publication No. 2002-305382 is known. FIG. 38 is a sectional view of the printed circuit board 500 disclosed in Japanese Patent Laid-Open Publication No. 2002-305382. FIG. 39 is a sectional view of the printed circuit board 500 in a bent state.

The printed circuit board 500, as illustrated in FIG. 38, includes a four-layer portion 500a, a heat radiating portion 500b, and a connecting portion 500c. The four-layer portion 500a, the heat radiating portion 500b and the connecting portion 500c are preferably formed by laminating insulating base plates 523a through 523f. More specifically, the insulating base plate 523c extends in a right-left direction. In the left-side portion of the insulating base plate 523c, the insulating base plates 523a and 523b are laminated on the upper main surface of the insulating base plate 523c, and the insulating base plate 523d is placed on the lower main surface of the insulating base plate 523c. Thereby, the four-layer portion 500a is formed. Also, in the right-side portion of the insulating base plate 523c, the insulating base plate 523e is placed on the upper main surface of the insulating base plate 523c, and the insulating base plate 523f is placed on the lower main surface of the insulating base plate 523c. Thereby, the heat radiating portion 500b is formed. The connecting portion 500c is a portion between the four-layer portion 500a and the heat radiating portion 500b.

In the printed circuit board 500, the thickness of the four-layer portion 500a and the thickness of the heat radiating portion 500b are greater than the thickness of the connecting portion 500c. Accordingly, the connecting portion 500c is more flexible than the four-layer portion 500a and the heat radiating portion 500b. Therefore, when the printed circuit board 500 is used, the connecting portion 500c is bent.

In the printed circuit board 500 disclosed in Japanese Patent Laid-Open Publication No. 2002-305382, however, the connecting portion 500c is likely to break at a portion near the border with the four-layer portion 500a as illustrated in FIG. 39.

More specifically, when the connecting portion 500c is bent, a tensile stress acts on and around the outer main surface of the bent connecting portion 500c. Accordingly, the portion of the connecting portion 500c around the outer main surface is stretched. As illustrated in FIGS. 38 and 39, in the four-layer portion 500a, the insulating base plates 523a and 523b are laminated on the upper main surface of the insulating base plate 523c, and the insulating base plate 523d is placed on the lower main surface of the insulating base plate 523c. Therefore, the insulating base plate 523c in the four-layer portion 500a is less stretchable than the insulating base plate 523c in the connecting portion 500c. In this structure, when the connecting portion 500c is bent, the insulating base plate 523c in the connecting portion 500c is stretched excessively so as to compensate for the short of stretch of the insulating base plate 523c in the four-layer portion 500a. Thus, there is a risk of breakage of the connecting portion 500c at a portion near the border with the four-layer portion 500a.

SUMMARY OF THE INVENTION

Preferred embodiments of the present invention provide a circuit board that significantly reduces or eliminates the risk of damage to a dielectric body when it is bent.

A circuit board according to a first aspect of various preferred embodiments of the present invention includes a plate-shaped dielectric body including a first main surface and a second main surface, the plate-shaped dielectric body including a first area not to be bent when the circuit board is used and a second area to be bent such that the first main surface and the second main surface become an outer side and an inner side, respectively, when the circuit board is used; a first reinforcing member located in the first area, nearer the first main surface than a center of the second area of the dielectric body in a thickness direction; and a second reinforcing member located in the first area, nearer the second main surface than the center of the second area of the dielectric body in the thickness direction, and contacting with a border between the first area and the second area, wherein the first reinforcing member is located farther away from the second area than the second reinforcing member; when the circuit board is used, the first main surface of the dielectric body curves from a portion overlapping a first edge of the first reinforcing member closest to the second area when viewed from a direction normal to the first main surface; when the circuit board is used, the second main surface of the dielectric body curves from a portion overlapping a second edge of the second reinforcing member on the border between the first area and the second area when viewed from a direction normal to the second main surface; and the first reinforcing member and the second reinforcing member are metal plates.

A circuit board according to a second aspect of various preferred embodiments of the present invention includes a plate-shaped dielectric body including a first main surface and a second main surface, the plate-shaped dielectric body including a first area not to be bent when the circuit board is used and a second area to be bent such that the first main surface and the second main surface become an outer side and an inner side, respectively, when the circuit board is used; a first reinforcing member located in the first area, nearer the first main surface than a center of the second area of the dielectric body in a thickness direction; a second reinforcing member located in the first area, nearer the second main surface than the center of the second area of the dielectric body in the thickness direction, and contacting with a border between the first area and the second area; and a first conductor provided at the dielectric body, wherein the first reinforcing member is located farther away from the second area than the second reinforcing member; when the circuit board is used, the first main surface of the dielectric body curves from a portion overlapping a first edge of the first reinforcing member closest to the second area when viewed from a direction normal to the first main surface; when the circuit board is used, the second main surface of the dielectric body curves from a portion overlapping a second edge of the second reinforcing member on the border between the first area and the second area when viewed from a direction normal to the second main surface; and the first reinforcing member and the second reinforcing member are portions of the first conductor and are not connected to any other conductors.

According to various preferred embodiments of the present invention, the risk of damage to a dielectric body when it is bent is significantly reduced or eliminated.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1A is a sectional view of a circuit board according to a preferred embodiment of the present invention.

FIG. 1B is a sectional view of the circuit board according to a preferred embodiment of the present invention.

FIG. 4 is an exploded view of the dielectric body of the circuit board illustrated in FIG. 1A.

FIG. 11 is an exploded view of the dielectric body of the circuit board illustrated in FIG. 8.

FIG. 21 is an exploded view of the dielectric body of the circuit board illustrated in FIG. 18.

FIG. 24 is a sectional view of a circuit board according to a fourth modification of a preferred embodiment of the present invention.

FIG. 25 is a plan view of a dielectric body of the circuit board illustrated in FIG. 24.

FIG. 37A is a sectional view of the circuit board of FIG. 33 in a bent state.

DETAILED DESCRIPTION OF THE PREFERRED EMBODIMENTS

Circuit boards according to preferred embodiments of the present invention will be described with reference to the drawings.

Figure 2:
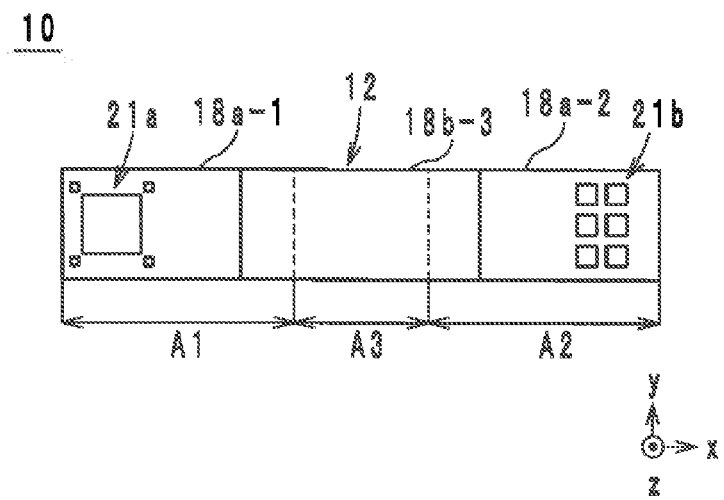
FIG. 2 is a plan view of a dielectric body of the circuit board illustrated in FIG. 1A.
Figure 3:
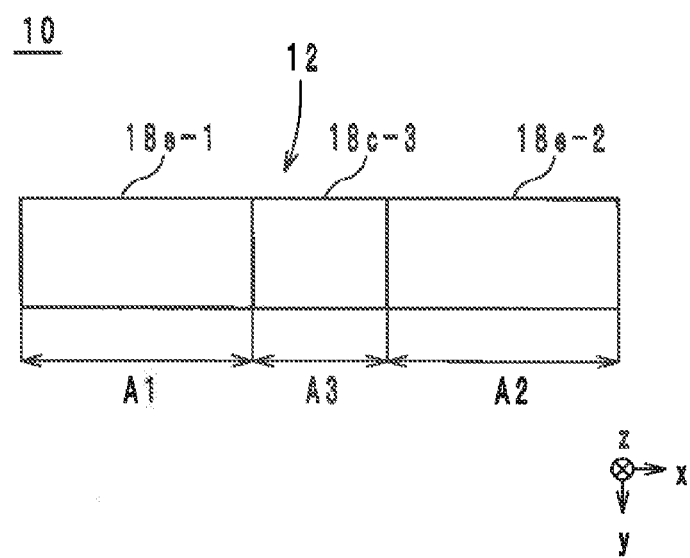
FIG. 3 is a plan view of the dielectric body of the circuit board illustrated in FIG. 1A.
Figure 5:
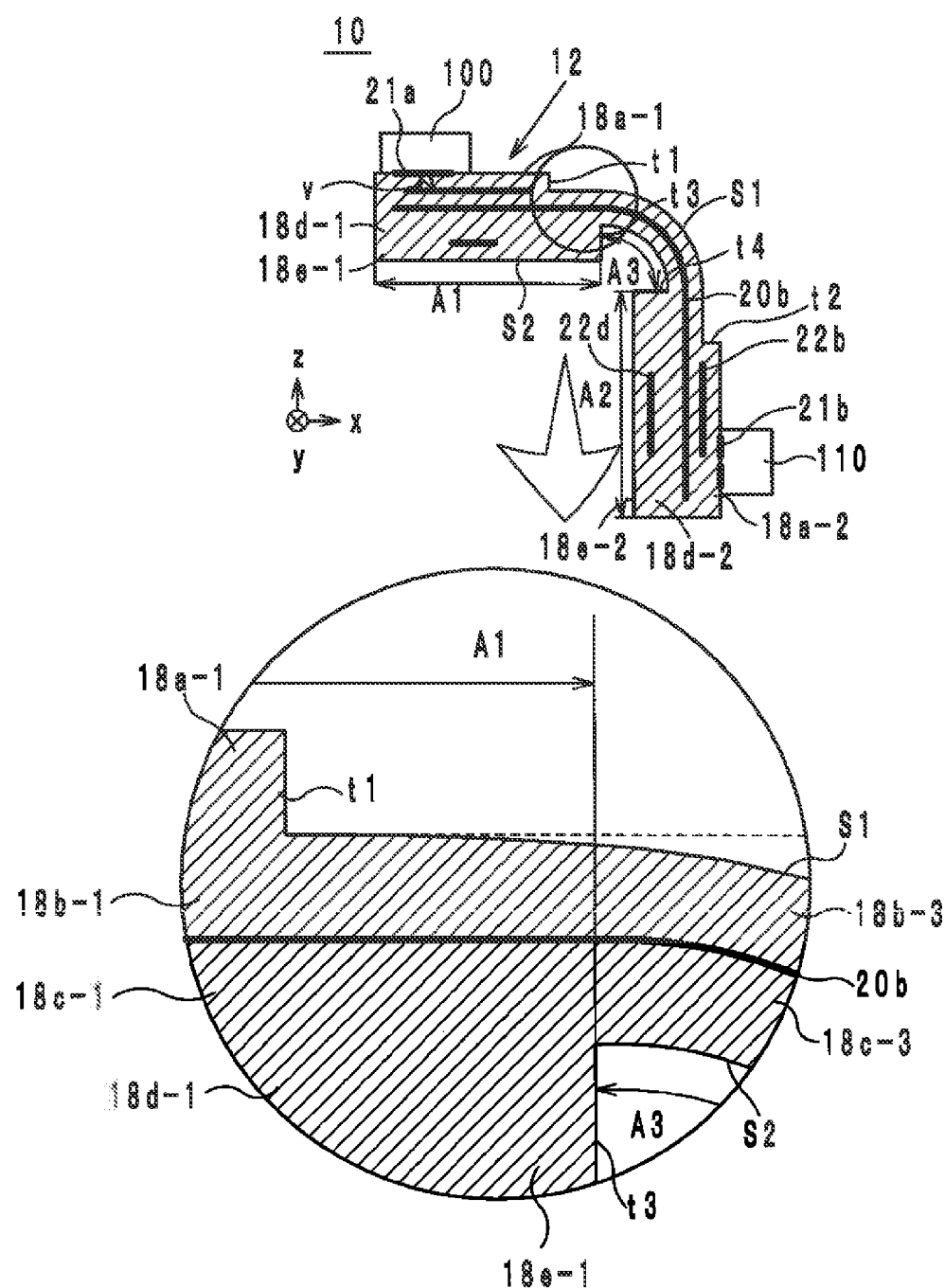
FIG. 5 is a sectional view of the circuit board of FIG. 1A in a bent state.

The structure of a circuit board according to various preferred embodiments of the present invention is described with reference to the drawings. FIGS. 1A and 1B are sectional views of a circuit board 10 according to a preferred embodiment of the present invention. FIGS. 2 and 3 are plan views of a dielectric body 12 of the circuit board 10 illustrated in FIG. 1A. FIG. 1A is a sectional view of a portion including a signal line 20b. FIG. 1B is a sectional view of a portion including a signal line 20a. FIG. 4 is an exploded view of the dielectric body 12 of the circuit board 10 illustrated in FIG. 1A. FIG. 5 is a sectional view of the circuit board 10 in a bent state. In the following, the direction of lamination of the circuit board 10 is defined as z-direction. The lengthwise direction of the circuit board 10 is defined as x-direction. The direction orthogonal to the x-direction and the z-direction is defined as y-direction.

The circuit board 10 is preferably used, for example, in an electronic device such as a cellphone or the like, and the circuit board 10 has a flexible portion. As illustrated in FIGS. 1A through 3, the circuit board 10 includes a dielectric body 12, signal lines 20a through 20c, external terminals 21a and 21b, circuit conductors 22b and 22d, and via-hole conductors v, v7 and v8. As will be described later, an integrated circuit 100 and a connector 110 are mounted on the circuit board 10.

As seen in FIG. 1A, the dielectric body 12 is a flexible plate-shaped member having a front surface S1 and a back surface S2. The front surface S1 is a main surface of the dielectric body 12 at a positive side in the z-direction, and the back surface S2 is a main surface of the dielectric body 12 at a negative side in the z-direction. When viewed from the z-direction, as illustrated in FIGS. 2 and 3, the dielectric body 12 preferably is in the shape of a rectangle extending in the x-direction and has base areas A1 and A2 and a connecting area A3. The connecting area A3 occupies the central portion of the dielectric body 12. The base area A1 is at a negative side in the x-direction of the connecting area A3. The base area A2 is at a positive side in the x-direction of the connecting area A3. The dielectric body 12 is, as seen in FIG. 1A, a laminate of dielectric sheets 18a through 18e stacked in this order from the positive side to the negative side in the z-direction.

The dielectric sheets 18a through 18e are sheets of flexible thermoplastic resin such as polyimide, liquid crystal polymer or the like. In the following, a main surface of each of the dielectric sheets 18a through 18e at the positive side in the z-direction is referred to as a front surface, and a main surface of each of the dielectric sheets 18a through 18e at the negative side in the z-direction is referred to as a back surface.

When viewed from the z-direction, as illustrated in FIG. 4, the dielectric sheet 18a includes two rectangular or substantially rectangular base portions 18a-1 and 18a-2.

When viewed from the z-direction, as illustrated in FIG. 4, the dielectric sheet 18b preferably has the same or substantially the same shape as the dielectric body 12 and is in the shape of a rectangle extending in the x-direction. The dielectric sheet 18b includes base portions 18b-1, 18b-2, and a connecting portion 18b-3.

When viewed from the z-direction, as illustrated in FIG. 4, the dielectric sheet 18c preferably has the same or substantially the same shape as the dielectric body 12 and is in the shape of a rectangle extending in the x-direction. The dielectric sheet 18c includes base portions 18c-1, 18c-2, and a connecting portion 18c-3.

When viewed from the z-direction, as illustrated in FIG. 4, the dielectric sheet 18d includes two rectangular or substantially rectangular base portions 18d-1 and 18d-2. When viewed from the z-direction, as illustrated in FIG. 4, the dielectric sheet 18e includes two rectangular or substantially rectangular base portions 18e-1 and 18e-2.

The connecting portions 18b-3 and 18c-3 constitute the connecting area A3 of the dielectric body 12. As seen in FIG. 4, the base portions 18a-1 through 18e-1 constitute the base area A1 of the dielectric body 12. Specifically, the base portion 18a-1 is placed on the surface of the base portion 18b-1 at the positive side in the z-direction, and the base portions 18d-1 and 18e-1 are stacked on the surface of the base portion 18c-1 at the negative side in the z-direction. Accordingly, the base portion 18a-1 is located nearer the front surface S1 of the dielectric body 12 in relation to the center of the connecting portion A3 in the z-direction (thickness direction). Also, the base portions 18d-1 and 18e-1 are located nearer the back surface S2 of the dielectric body 12 in relation to the center of the connecting portion A3 in the z-direction (thickness direction).

As seen in FIG. 4, the base portions 18a-2 through 18e-2 constitute the base area A2 of the dielectric body 12. Specifically, the base portion 18a-2 is placed on the surface of the base portion 18b-2 at the positive side in the z-direction, and the base portions 18d-2 and 18e-2 are stacked on the surface of the base portion 18c-2 at the negative side in the z-direction. Accordingly, the base portion 18a-2 is located nearer the front surface S1 of the dielectric body 12 in relation to the center of the connecting portion A3 in the z-direction (thickness direction). Also, the base portions 18d-2 and 18e-2 are located nearer the back surface S2 of the dielectric body 12 in relation to the center of the connecting portion A3 in the z-direction (thickness direction).

The base portions 18a-1, 18a-2, 18b-1 and 18b-2, and the connecting portion 18b-3 constitute the front surface S1 of the dielectric body 12. The base portions 18e-1 and 18e-2, and the connecting portion 18c-3 constitute the back surface S2 of the dielectric body 12.

The short sides of the base portions 18d-1 and 18e-1 extending in the y-direction at the positive end in the x-direction are located on the border of the base area A1 with the connecting area A3. Accordingly, when viewed from the z-direction, the border between the base area A1 and the connecting area A3 is located on the short sides of the base portions 18d-1 and 18e-1 extending in the y-direction at the positive end in the x-direction. The short sides of the base portions 18d-2 and 18e-2 extending in the y-direction at the negative end in the x-direction are located on the border of the base area A2 with the connecting area A3. Accordingly, when viewed from the z-direction, the border between the base area A2 and the connecting area A3 is on the short sides of the base portions 18d-2 and 18e-2 extending in the y-direction at the positive end in the x-direction.

On the other hand, the short side of the base portion 18a-1 extending in the y-direction at the positive end in the x-direction is located in the base area A1, that is, located farther in the negative x-direction than the border between the base area A1 and the connecting area A3. Accordingly, the short side of the base portion 18a-1 extending in the y-direction at the positive end and the border between the base area A1 and the connecting area A3 are located separately from each other in the x-direction. Thus, the short side of the base portion 18a-1 extending in the y-direction at the positive end in the x-direction is spaced away from the connecting area A3 and located farther in the negative x-direction than the short sides of the base portions 18d-1 and 18e-1 extending the y-direction at the positive end in the x-direction.

The short side of the base portion 18a-2 extending in the y-direction at the negative end in the x-direction is located in the base area A2, that is, located farther in the positive x-direction than the border between the base area A2 and the connecting area A3. Accordingly, the short side of the base portion 18a-2 extending in the y-direction at the negative end in the x-direction and the border between the base area A2 and the connecting area A3 are located separately from each other in the x-direction. Thus, the short side of the base portion 18a-2 extending in the y-direction at the negative end in the x-direction is spaced away from the connecting area A3 and located farther in the positive x-direction than the short sides of the base portions 18a-2 and 18e-2 extending in the y-direction at the negative end in the x-direction.

With the arrangements of the base portions 18a-1, 18a-2, 18d-1, 18d-2, 18e-1 and 18e-2, as seen in FIG. 1A, the distance l1 between edges t1 and t2 is greater than the distance l2 between edges t3 and t4. The edge t1 indicates the edge (short side) of the base portion 18a-1 at the positive end in the x-direction. The edge t2 indicates the edge (short side) of the base portion 18a-2 at the negative end in the x-direction. The edge t3 indicates the edges (short sides) of the base portions 18d-1 and 18e-1 at the positive end in the x-direction. The edge t4 indicates the edges (short sides) of the base portions 18d-2 and 18e-2 at the negative end in the x-direction.

The thicknesses (sizes in the z-direction) D1 of the base areas A1 and A2 of the dielectric body 12 are greater than the thickness (size in the z-direction) D2 of the connecting area A3 of the dielectric body 12 by the total of the thicknesses of the dielectric sheets 18a, 18d and 18e. Thus, in the circuit board 10, the base portions 18a-1, 18d-1 and 18e-1 define and function as reinforcing members of the base area A1, and the base portions 18a-2, 18d-2 and 18e-2 define and function as reinforcing members of the base area A2. Therefore, the connecting area A3 is more flexible than the base areas A1 and A2. As illustrated in FIG. 5, when the circuit board 10 is used, the connecting area A3 of the dielectric body 12 is bent such that the front surface S1 and the back surface S2 become the outer side and the inner side respectively. On the other hand, the base areas A1 and A2 are not bent as illustrated in FIG. 5 when the circuit board 10 is used.

The signal lines 20a through 20c are, for example, to transmit high-frequency signals, and each of the signal lines 20a through 20c is a linear conductor embedded in the dielectric body 12. In this preferred embodiment, the signal lines 20a through 20c are provided on the front surface of the dielectric sheet 18c, and each of the signal lines 20a through 20c is a linear conductor extending in the x-direction from the base area A1 to the base area A2 across the connecting area A3. The signal lines 20a through 20c are formed of a metal material with a low specific resistance containing mainly of silver or copper. The statement that the signal lines 20a through 20c are provided on the front surface of the dielectric sheet 18c indicates that the signal lines 20a through 20c are preferably formed by plating the front surface of the dielectric sheet 18c with a metal foil and by patterning the metal foil or that the signal lines 20a through 20c are preferably formed by applying a metal foil on the front surface of the dielectric sheet 18c and by patterning the metal foil. The surfaces of the signal lines 20a through 20c are smoothened, and therefore, the respective surfaces of the signal lines 20a through 20c in contact with the dielectric sheet 18c have a greater surface roughness than the respective surfaces of the signal lines 20a through 20c out of contact with the dielectric sheet 18c.

The external terminal 21a, as seen in FIG. 2, includes a plurality of rectangular or substantially rectangular conductors provided on the front surface of the base portion 18a-1. As seen in FIG. 1, the integrated circuit 100 is mounted on the external terminal 21a. The external terminal 21b, as seen in FIG. 2, includes a plurality of rectangular or substantially rectangular conductors provided on the front surface of the base portion 18a-2. As seen in FIG. 1, the connector 110 is mounted on the external terminal 21b. The statement that the external terminals 21a and 21b are provided on the front surfaces of the base portions 18a-1 and 18a-2 respectively indicates that the external terminals 21a and 21b are preferably formed by plating the front surfaces of the base portions 18a-1 and 18a-2 with metal foils and by patterning the metal foils or that the external terminals 21a and 21b are preferably formed by applying metal foils on the front surfaces of the base portions 18a-1 and 18a-2 and by patterning the metal foils.

The circuit conductors 22b are conductors provided on the front surfaces of the base portions 18b-1 and 18b-2, and specifically, the circuit conductors 22b are coils, capacitors, wirings, etc. embedded in the base areas A1 and A2. The statement that the circuit conductors 22b are provided on the front surfaces of the base portions 18b-1 and 18a-2 indicates that the circuit conductors 22b are preferably formed by plating the front surfaces of the base portions 18b-1 and 18b-2 with metal foils and by patterning the metal foils or that the circuit conductor 22b are preferably formed by applying metal foils on the front surfaces of the base portions 18b-1 and 18b-2 and by patterning the metal foils.

The circuit conductors 22d are conductors provided on the back surfaces of the base portions 18d-1 and 18d-2, and specifically, the circuit conductors 22d are coils, capacitors, wirings, etc. embedded in the base areas A1 and A2. The statement that the circuit conductors 22d are provided on the back surfaces of the base portions 18d-1 and 18d-2 indicates that the circuit conductors 22d are preferably formed by plating the back surfaces of the base portions 18d-1 and 18d-2 with metal foils and by patterning the metal foils or that the circuit conductor 22d are preferably formed by applying metal foils on the back surfaces of the base portions 18d-1 and 18d-2 and by patterning the metal foils.

The via-hole conductors v are interlayer connection conductors pierced in the base portion 18a-1 in the z-direction so as to connect the external terminal 21a to the circuit conductors 22b. The via-hole conductors v are preferably formed by making through holes piercing the base portion 18a-1 in the z-direction and by filling the through holes with a conductive paste. Such via-hole conductors v are provided not only in the base portion 18a-1 but also in other portions of the dielectric body 12.

As seen in FIG. 1B, the via-hole conductors v7 are interlayer connection conductors pierced in the base portion 18b-1 in the z-direction so as to connect the circuit conductors 22b to the signal line 20a. The via-hole conductors v7 are preferably formed by making through holes piercing the base portion 18b-1 in the z-direction and by filling the through holes with a conductive paste. Each of the via-hole conductors v7 is preferably configured such that the diameter of the negative end in the z-direction is greater than the diameter of the positive end in the z-direction. Accordingly, the thicker ends of the via-hole conductors v7 contact with the signal line 20a.

As seen in FIG. 1B, the via-hole conductors v8 are interlayer connection conductors pierced in the base portion 18b-2 in the z-direction so as to connect the circuit conductors 22b to the signal line 20a. The via-hole conductors v8 are preferably formed by making through holes piercing the base portion 18b-2 in the z-direction and by filling the through holes with a conductive paste. Each of the via-hole conductors v8 is preferably configured such that the diameter of the negative end in the z-direction is greater than the diameter of the positive end in the z-direction. Accordingly, the thicker ends of the via-hole conductors v8 contact with the signal line 20a.

The integrated circuit 100 preferably is a semiconductor integrated circuit, and for example, is a drive circuit configured to drive an electronic device in which the circuit board 10 is provided. As mentioned above, the integrated circuit 100 is mounted on the external terminal 21a provided on the base area A1. The connector 110 is an external connector to be connected to a connector of a mother board or the like. As mentioned above, the connector 110 is mounted on the external terminal 21b provided on the base area A2.

In the circuit board 10 having the structure above, the connecting area A3 is bent as illustrated in FIG. 5 when it is used. Specifically, as described above, the base portions 18a-1, 18d-1 and 18e-1 are provided in the base area A1 as reinforcing members, and the base portions 18a-2, 18d-2 and 18e-2 are provided in the base area A2 as reinforcing members. On the other hand, no reinforcing members are provided in the connecting area A3. Accordingly, the connecting area A3 is more flexible than the base areas A1 and A3, and in the circuit board 10, the connecting area A3 is bendable. As illustrated in FIG. 5, the connecting area A3 of the dielectric body 12 is bent such that the front surface S1 and the back surface S2 become the outer side and the inner side respectively.

The bending of the connecting area A3 of the dielectric body 12 causes a tensile stress to act on the front surface of the connecting portion 18b-3 of the dielectric sheet 18b. Then, the tensile stress acting on the connecting portion 18b-3 causes a tensile stress to act on the front surface of the base portion 18b-1 of the dielectric sheet 18b. In this regard, as seen in FIG. 5, the distance in the x-direction between the base portion 18a-1 and the connecting area A3 is greater than the distance in the x-direction between the base portions 18d-1 and 18e-1 and the connecting area A3. Accordingly, the front surface S1 in the portion from the border between the base area A1 and the connecting area A3 to the edge t1 of the base portion 18a-1 is defined by the front surface of the dielectric sheet 18b (more specifically, the front surface of the base portion 18b-1). Therefore, when the circuit board 10 is used, the front surface S1 curves from the portion overlapping the edge t1 in the z-direction. However, the curvature of the front surface S1 in the portion from the border between the base area A1 and the connecting area A3 to the edge t1 of the base portion 18a-1 is smaller than the curvature of the front surface S1 in the connecting area A3.

The back surface S2 in the portion from the border between the base area A1 and the connecting area A3 to the edge t1 of the base portion 18a-1 is defined by the back surface of the dielectric sheet 18e (more specifically, the back surface of the base portion 18e-1). Accordingly, there is a level difference between the back surface S2 in the portion from the border between the base area A1 and the connecting area A3 to the edge t1 of the base portion 18a-1 and the back surface S2 in the connecting area A3. Therefore, unlike the front surface S1 in the portion from the border between the base area A1 and the connecting area A3 to the edge t1 of the base portion 18a-1, the back surface S2 in the portion from the border between the base area A1 and the connecting area A3 to the edge t1 of the base portion 18a-1 does not curve. Thus, when the circuit board 10 is used, the back surface S2 curves from the portion overlapping the edge t3 in the z-direction.

The back surface S2 in the portion from the border between the base area A1 and the connecting area A3 to the edge t1 of the base portion 18a-1 may curve slightly. However, the curvature of the back surface S2 in the portion from the border between the base area A1 and the connecting area A3 to the edge t1 of the base portion 18a-1 will be much smaller than the curvature of the back surface S2 in the connecting area A3.

Further, when the circuit board 10 is used, the front surface S1 curves from the portion overlapping the edge t2 in the x-direction, and the back surface S2 curves from the portion overlapping the edge t4 in the x-direction. The curve of the dielectric body 12 around the border between the base area A2 and the connecting area A3 is similar to the curve of the dielectric body 12 around the border between the base area A1 and the connecting area A3, and a description of the curve is omitted here.

Figure 6:
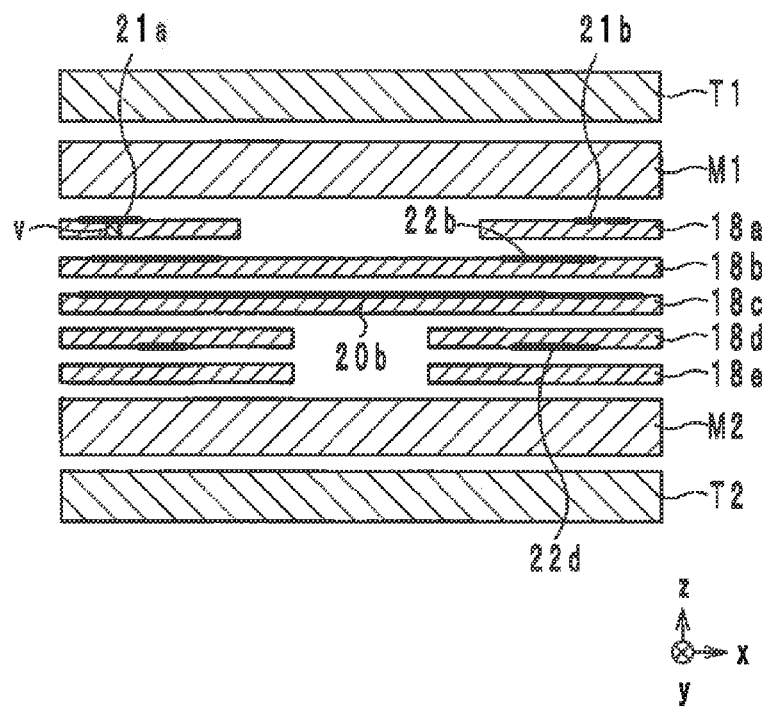
FIG. 6 is a sectional view illustrating a pressure-bonding step to form the dielectric body of the circuit board.
Figure 7:
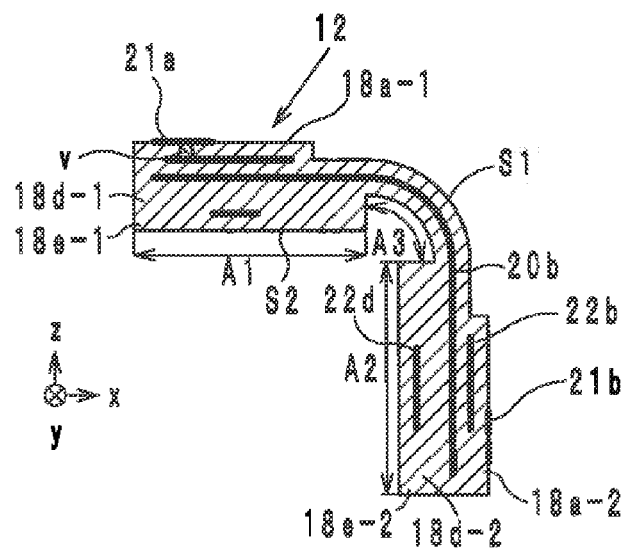
FIG. 7 is a sectional view illustrating a bending step to bend the dielectric body.

A non-limiting example of a manufacturing method of the circuit board 10 is described below with reference to the drawings. FIG. 6 is a sectional view illustrating a pressure-bonding process to form the dielectric body 12. FIG. 7 is a sectional view illustrating a bending process to bend the dielectric body 12. In the following, a manufacturing method of one circuit board 10 is described as an example. Practically, however, many circuit boards 10 are manufactured at once by laminating large-sized dielectric sheets and by cutting the laminate of the dielectric sheets.

First, dielectric sheets, each formed of thermoplastic resin and having a copper foil (metal film) entirely on one main surface, are prepared as the dielectric sheets 18a through 18d. Specifically, copper foils are applied to respective one main surface of the dielectric sheets 18a through 18c. The surfaces of the copper foils are, for example, galvanized for corrosion proof and thus are smoothened. The dielectric sheets 18a through 18d are formed of liquid polymer. The thicknesses of the copper foils are preferably within a range from about 10 μm to about 20 μm, for example. Further, a sheet of thermoplastic resin with no copper foil thereon is prepared as the dielectric sheet 18e.

Next, the external terminals 21a and 21b as illustrated in FIG. 2 are formed on the front surface of the dielectric sheet 18a by patterning the copper foil formed on the front surface of the dielectric sheet 18a. Specifically, resists having identical shapes to the external terminals 21a and 21b are printed on the copper foil on the front surface of the dielectric sheet 18a. Then, the copper foil is etched, so that the portions of the copper foil not covered by the resists are removed. Thereafter, a cleaning solution is sprayed so as to remove the resists. In this way, the external terminals 21a and 21b as illustrated in FIG. 2 are formed on the front surface of the dielectric sheet 18a by photolithography.

Next, the circuit conductors 22b as illustrated in FIG. 1A are formed on the front surface of the dielectric sheet 18b. The signal lines 20a through 20c as illustrated in FIG. 1A are formed on the front surface of the dielectric sheet 18c. The circuit conductors 22d as illustrated in FIG. 1A are formed on the back surface of the dielectric sheet 22d. The processes for forming the signal lines 20a through 20c and the circuit conductors 22b and 22d are preferably the same as the process for forming the external terminals 21a and 21b, and descriptions of the processes are omitted here.

Next, the dielectric sheet 18a is exposed to laser beams such that through holes are made in the dielectric sheets 18a through 18c at the positions of the via-hole conductors v. In this regard, the main surface with no copper foil (back surface) faces the laser beam irradiation, and thus, the diameter of each of the through holes at the negative end in the z-direction is greater than the diameter at the positive end in the z-direction. Thereafter, conductive paste is filled in the through holes. Further, the via-hole conductors v7 and v8 are preferably formed by the same process as described above.

The dielectric sheets 18a through 18e are laminated in this order from the positive side to the negative side in the z-direction, and the laminate is subjected to a pressure-bonding process and a heating process. Specifically, a cushion M1 is placed on the surface of the dielectric body 12 at the positive side in the z-direction, and a cushion M2 is placed on the surface of the dielectric body 12 at the negative side in the z-direction. Then, the dielectric body 12 is pressed between dies T1 and T2 via the cushions M1 and M2, and simultaneously, heat is applied to the dielectric body 12. Thereby, the dielectric sheets 18a through 18e soften, and the conductive paste filled in the through holes hardens. In this way, the dielectric sheets 18a through 18e are joined together.

Next, while the dielectric body 12 is heated, the connecting area A3 is bent as illustrated in FIG. 7 by use of a mold. Thereafter, the dielectric body 12 is cooled. With this arrangement, the dielectric body 12 becomes capable of keeping in a bent state.

Finally, the integrated circuit 100 is mounted on the front surface of the base area A1, and the connector 110 is mounted on the front surface of the base area A2. Through the process above, the circuit board 10 is obtained.

The circuit board 10 having the structure above significantly reduces or eliminates the risk of damage to the dielectric body 12 caused in a bending process. Specifically, when the circuit board 10 is used, the connecting area A3 is bent. As described above, when the connecting area A3 is bent, the front surface S1 curves from the portion overlapping the edge t1 of the base portion 18a-1 in the z-direction (see FIG. 5). In this moment, the base portion 18b-1 in the base area A1 as well as the connecting portion 18b-3 in the connecting area A3 stretches. Thus, stress concentration around the border between the base area A1 and the connecting area A3 is avoided, and damage to the connecting portion 18b-3 is prevented. Further, for the same reason, damage to the connecting portion 18b-3 around the border between the base area A2 and the connecting portion A3 is prevented.

In the circuit board 10, the base portions 18a-1, 18d-1 and 18e-1 are provided as reinforcing members. Accordingly, the curved portion of the dielectric body 12 is determined by the edge t1 of the base portion 18a-1 and the edge t3 of the base portions 18d-1 and 18e-1. This significantly reduces the risk of variations in the curved portion of the dielectric body 12. Accordingly, when the circuit board 10 is attached to a metal object, such as a case or a battery pack of an electronic device, the positional relation between the metal body and the circuit board will not vary. Consequently, variations in the distance between the signal lines 20a through 20c in the circuit board 10 and the metal object are prevented, and variations in the capacitance between the signal lines 20a through 20c and the metal body are prevented. Therefore, variations in the characteristics of the signal lines 20a through 20c are prevented.

In the circuit board 10, for reinforcement, the base portion 18a-1 are provided at the positive side in the z-direction, and the base portions 18d-1 and 18e-1 are provided at the negative side in the z-direction. These portions provide guides used to bend of the circuit board 10 from both surfaces and facilitate bending of the circuit board 10.

If the distance between the border between the base area A1 and the connecting area A3 and the edge t1 is 13 (see FIG. 1A), it is preferred that the distance 13 and the thickness D2 of the connecting area A3 satisfy the following condition (1).

$$D2/4 \leq 13 \leq 2 \cdot D2 \quad (1)$$

If the distance 13 is smaller than D2/4, the effect of preventing damage to the dielectric body 12 can not be fully obtained. On the other hand, if the distance 13 is greater than 2·D2, the front surface S1 and the back surface S2 in the portion from the border between the base area A1 and the connecting area A3 to the edge t1 curve so largely as to cause a bend of the dielectric body 12 in this portion, and the bent position of the dielectric body 12 may vary.

From this viewpoint, it is more favorable that the distance 13 and the thickness D2 of the connecting area A3 satisfy the following condition (2).

$$D2/2 \leq 13 \leq 1.5 \cdot D2 \quad (2)$$

In the circuit board 10, also, disconnection between each of the via-hole conductors v7 and v8 and the signal line 20a is prevented. Specifically, when the connecting portion A3 of the circuit board 10 is bent, the signal line 20a in the base area A1 is pulled in the positive x-direction, and the signal line 20a in the base area A2 is pulled in the negative x-direction. In this moment, forces are applied between the via-hole conductor v7 and the signal line 20a and between the via-hole conductor v8 and the signal line 20a, which may cause disconnection. In order to diminish this risk, in the circuit board 10, the respective thicker ends of the via-hole conductors v7 and v8 contact with the signal line 20a. Thus, the area of contact between the signal line 20a and each of the via-hole conductors v7 and v8 becomes greater, and the contact between the signal line 20a and each of the via-hole conductors v7 and v8 becomes firm. Consequently, in the circuit board 10, disconnection between each of the via-hole conductors v7 and v8 and the signal line 20a is prevented.

The via-hole conductors v7 and v8 are not necessarily connected to the signal line 20a and may be connected to any other conductor that extends across the base area A1 and the connecting area A3 or across the base area A2 and the connecting area A3.

First Modification

Figure 8:
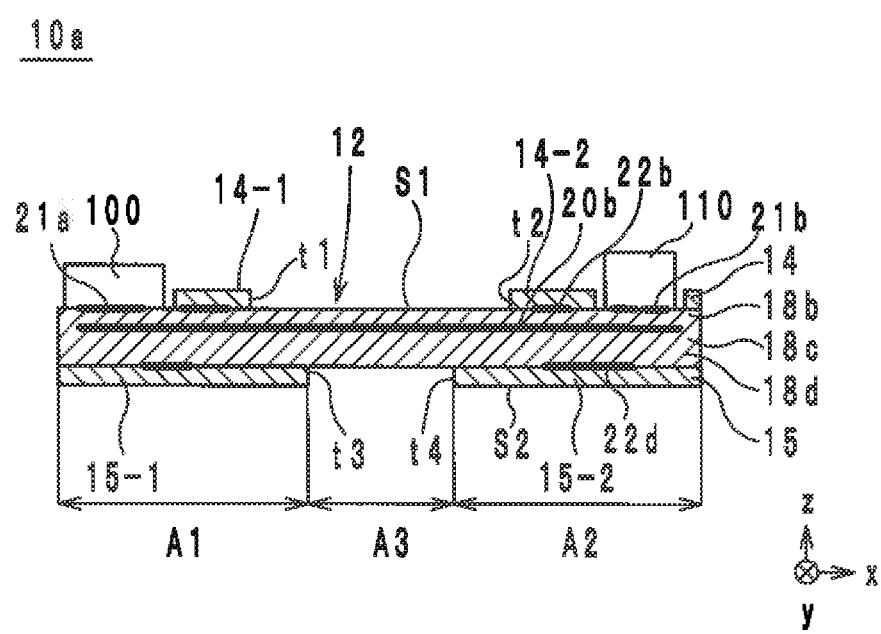
FIG. 8 is a sectional view of a circuit board according to a first modification of a preferred embodiment of the present invention.
Figure 9:
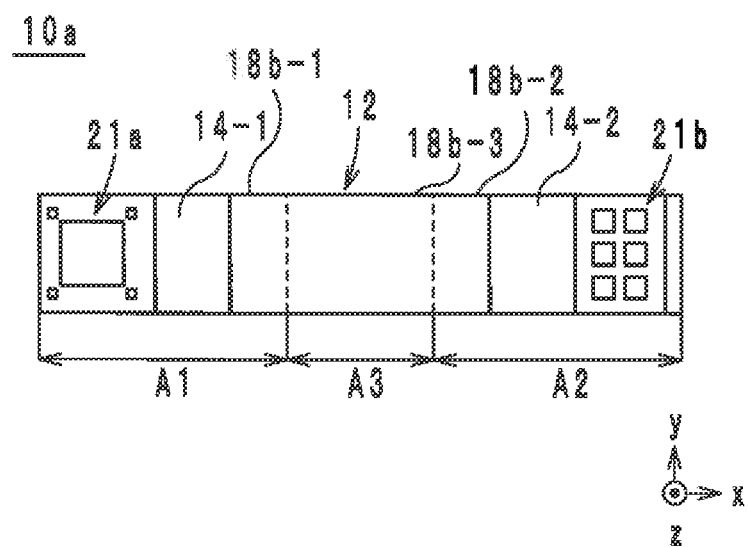
FIG. 9 is a plan view of a dielectric body of the circuit board illustrated in FIG. 8.
Figure 10:
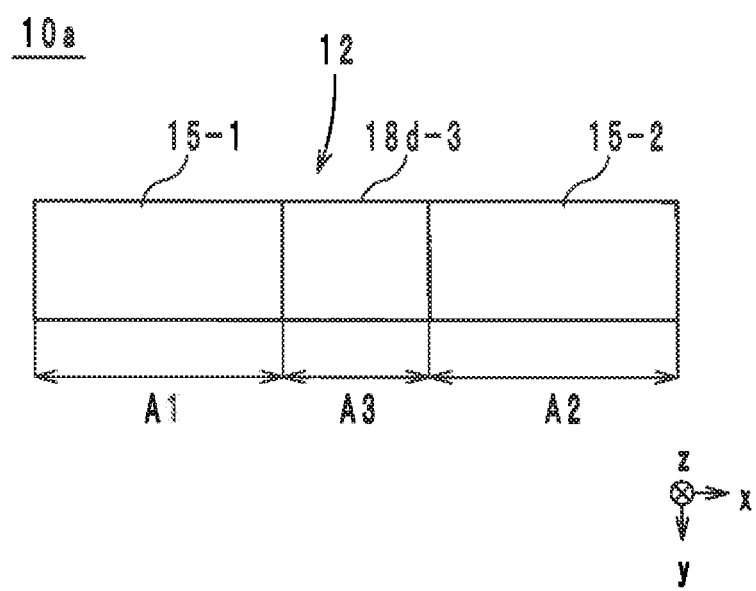
FIG. 10 is a plan view of the dielectric body of the circuit board illustrated in FIG. 8.
Figure 12:
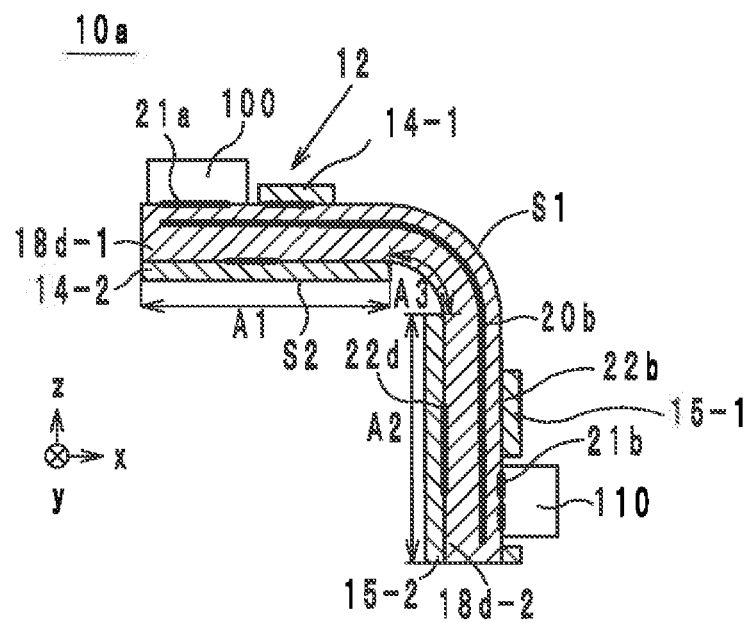
FIG. 12 is a sectional view of the circuit board of FIG. 8 in a bent state.

A circuit board 10a according to a first modification of a preferred embodiment of the present invention is described with reference to the drawings. FIG. 8 is a sectional view of the circuit board 10a according to the first modification. FIGS. 9 and 10 are plan views of the dielectric body 12 of the circuit board 10a illustrated in FIG. 8. FIG. 11 is an exploded view of the dielectric body 12 of the circuit board 10a. FIG. 12 is a sectional view of the circuit board 10a in a bent state.

The circuit board 10a is different from the circuit board 10 in that protective layers 14 and 15 are provided instead of the dielectric sheets 18a and 18e and that the external terminals 21a and 21b are provided on the front surface of the dielectric sheet 18b. The following description of the circuit board 10a is focused on the differences.

The external terminals 21a and 21b are provided on the front surface of the base portions 18b-1 and 18b-2, respectively, of the dielectric sheet 18b.

The protective layer 14 is, for example, a resist layer formed of resin and covers the circuit conductors 22b provided on the dielectric body 12. The protective layer 14 is a portion of the dielectric body 12, and includes base portions 14-1 and 14-2. As seen in FIG. 9, the base portions 14-1 and 14-2 are placed at the most positive sides in the z-direction of the base areas A1 and A2 respectively. However, the base portions 14-1 and 14-2 of the protective layer 14 are not provided around the external terminals 21a and 21b so that the external terminals 21a and 21b are exposed. Thus, the front surface of the protective layer 14 defines portions of the front surface S1 of the dielectric body 12.

The protective layer 15 is, for example, a resist layer formed of resin. The protective layer 15 is a portion of the dielectric body 12, and includes base portions 15-1 and 15-2. As seen in FIG. 10, the base portions 15-1 and 15-2 are placed at the most negative sides in the z-direction of the base areas A1 and A2, respectively. Thus, the back surface of the protective layer 15 defines portions of the back surface S2 of the dielectric body 12.

The base portions 14-1 and 15-1, as seen in FIGS. 8 through 11, define and function as reinforcing members of the base area A1 as the base portions 18a-1, 18d-1 and 18e-1 do in the circuit board 10. The short side of the base portion 15-1 extending in the y-direction at the positive end in the x-direction is located on the border of the base area A1 with the connecting area A3. The short side of the base portion 14-1 extending in the y-direction at the positive end in the x-direction is spaced away from the connecting area A3 and located farther in the negative x-direction than the short side of the base portion 15-1 extending in the y-direction at the positive end in the x-direction.

The base portions 14-2 and 15-2, as seen in FIGS. 8 through 11, define and function as reinforcing members of the base area A2 as the base portions 18a-2, 18d-2 and 18e-2 do in the circuit board 10. The short side of the base portion 15-2 extending in the y-direction at the negative end in the x-direction is located on the border of the base area A2 with the connecting area A3. The short side of the base portion 14-2 extending in the y-direction at the negative end in the x-direction is spaced away from the connecting area A3 and located farther in the positive x-direction than the short side of the base portion 15-2 extending in the y-direction at the negative end in the x-direction.

When the circuit board 10a is used, the connecting area A3 is bent as illustrated in FIG. 12. The curve around the border between the base area A1 and the connecting area A3 of the circuit board 10a is similar to the curve around the border between the base area A1 and the connecting area A3 of the circuit board 10, and a description of the curve is omitted here. The curve around the border between the base area A2 and the connecting area A3 of the circuit board 10a is similar to the curve around the border between the base area A2 and the connecting area A3 of the circuit board 10, and a description of the curve is omitted here.

The circuit board 10a having the structure above has the same effects as the circuit board 10.

Second Modification

Figure 13:
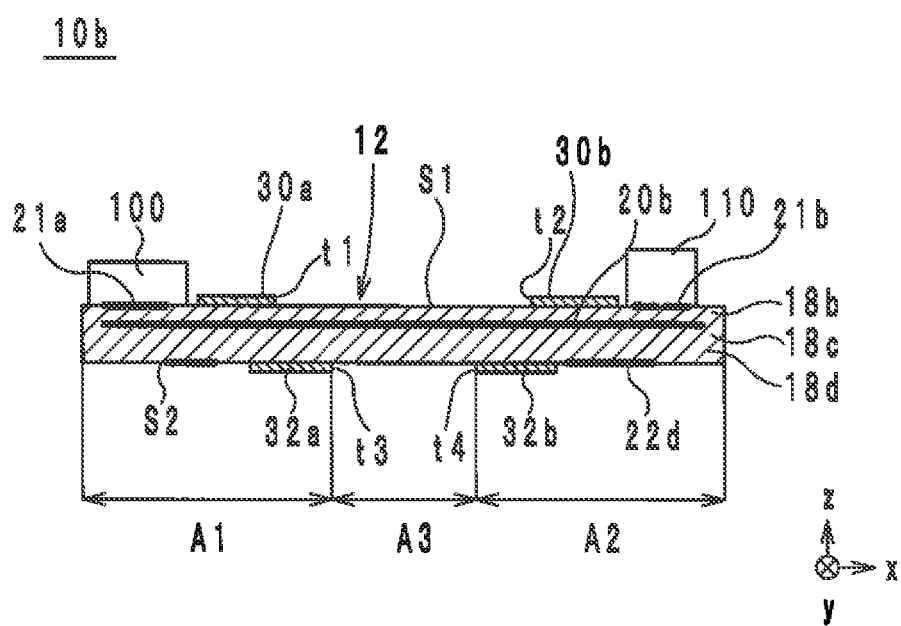
FIG. 13 is a sectional view of a circuit board according to a second modification of a preferred embodiment of the present invention.
Figure 14:
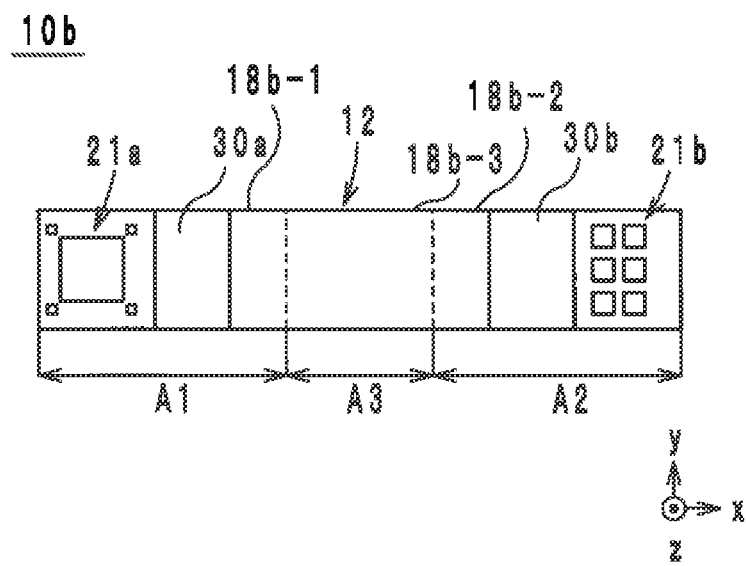
FIG. 14 is a plan view of a dielectric body of the circuit board illustrated in FIG. 13.
Figure 15:
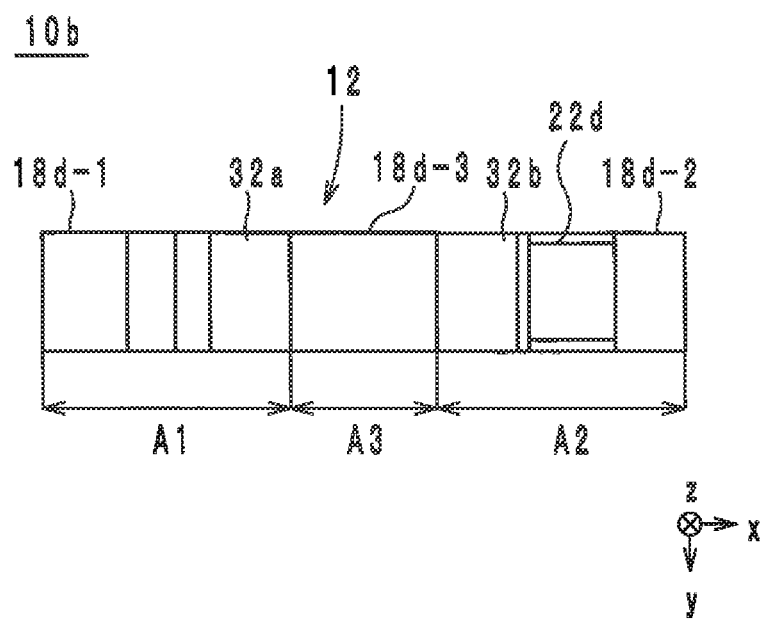
FIG. 15 is a plan view of the dielectric body of the circuit board illustrated in FIG. 13.
Figure 16:
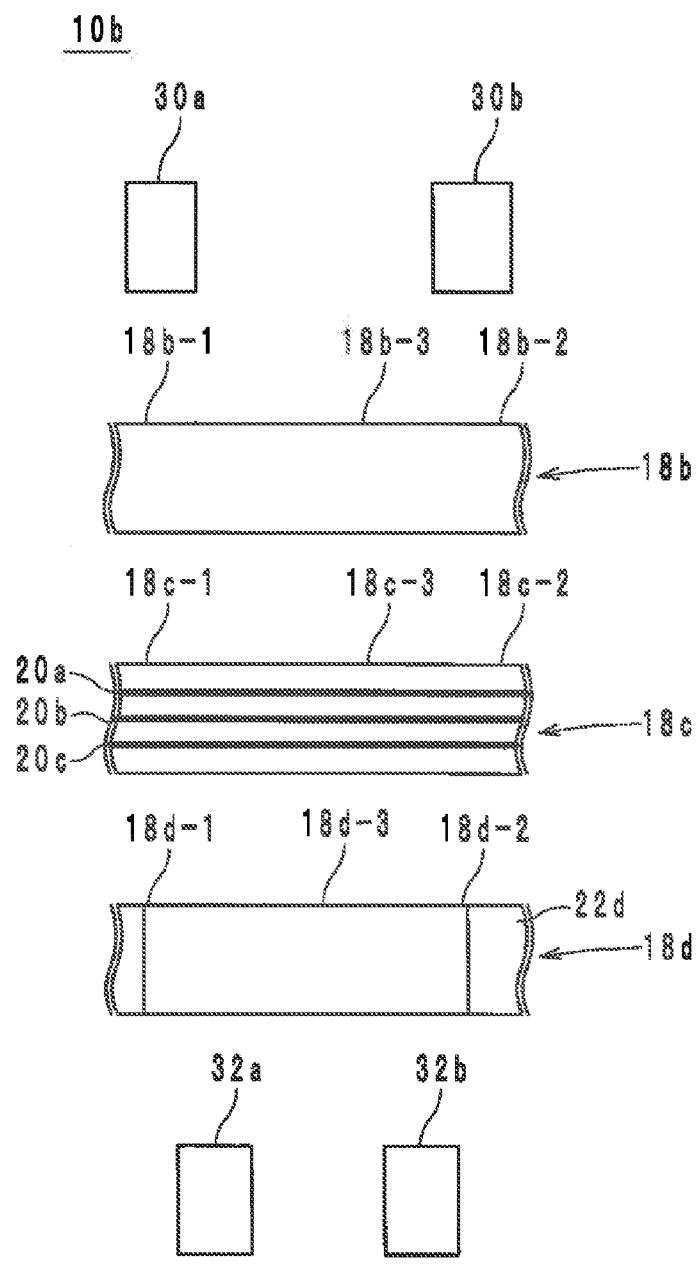
FIG. 16 is an exploded view of the dielectric body of the circuit board illustrated in FIG. 13.
Figure 17:
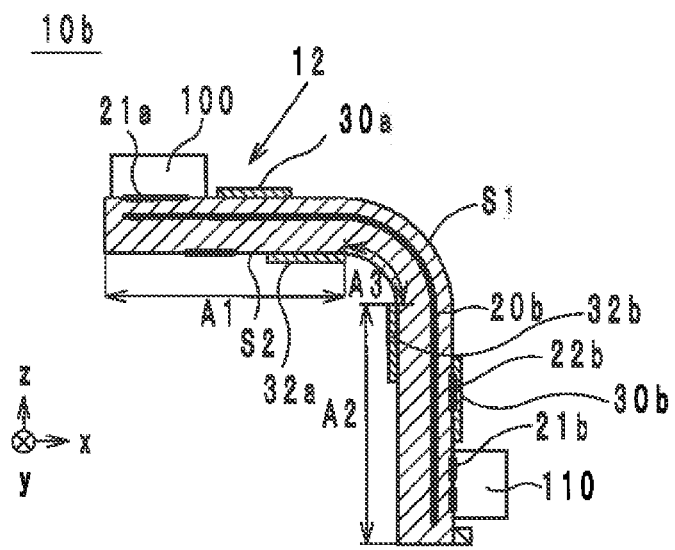
FIG. 17 is a sectional view of the circuit board of FIG. 13 in a bent state.

A circuit board 10b according to a second modification of a preferred embodiment of the present invention is described with reference to the drawings. FIG. 13 is a sectional view of the circuit board 10b according to the second modification. FIGS. 14 and 15 are plan views of the dielectric body 12 of the circuit board 10b illustrated in FIG. 13. FIG. 16 is an exploded view of the dielectric body of the circuit board 10b illustrated in FIG. 13. FIG. 17 is a sectional view of the circuit board 10b in a bent state.

The circuit board 10b is different from the circuit board 10a in that metal plates 30a, 30b, 32a and 32b are provided instead of the protective layers 14 and 15. The following description of the circuit board 10b is focused on the difference.

The metal plate 32a is, for example, a stainless-steel plate, and is provided on the back surface S2 of the base area A1 as seen in FIGS. 13, 15 and 16. The metal plate 32a is stuck on the back surface S2 of the base area A1, for example, by an adhesive and defines and functions as a reinforcing member. The short side of the metal plate 32a extending in the y-direction at the positive end in the x-direction is located on the border of the base area A1 with the connecting area A3.

The metal plate 30a is, for example, a stainless-steel plate, and is provided on the front surface S1 of the base area A1 as seen in FIGS. 13, 15 and 16. The metal plate 30a is stuck on the front surface S1 of the base area A1, for example, by an adhesive and defines and functions as a reinforcing member. The short side of the metal plate 30a extending in the y-direction at the positive end in the x-direction is spaced away from the connecting area A3 and located farther in the negative x-direction than the short side of the metal plate 32a extending in the y-direction at the positive end in the x-direction.

The metal plate 32b is, for example, a stainless-steel plate, and is provided on the back surface S2 of the base area A1 as seen in FIGS. 13, 15 and 16. The metal plate 32b is stuck on the back surface S2 of the base area A2, for example, by an adhesive and defines and functions as a reinforcing member. The short side of the metal plate 32b extending in the y-direction at the negative end in the x-direction is located on the border of the base area A2 with the connecting area A3.

The metal plate 30b is, for example, a stainless-steel plate, and is provided on the front surface S1 of the base area A2 as seen in FIGS. 13, 15 and 16. The metal plate 30b is stuck on the front surface S1 of the base area A2, for example, by an adhesive and defines and functions as a reinforcing member. The short side of the metal plate 30b extending in the y-direction at the negative end in the x-direction is spaced away from the connecting area A3 and located farther in the positive x-direction than the short side of the metal plate 32b extending in the y-direction at the negative end in the x-direction.

The metal plates 30a, 30b, 32a and 32b are not connected to any other circuit conductors. Accordingly, the potential of the metal plates 30a, 30b, 32a and 32b becomes a floating potential when the circuit board 10b is used. The floating potential is a potential between the ground potential and the potential of the signal lines 20a through 20c. Therefore, even if any of the metal plates 30a, 30b, 32a and 32b curves after bending of the circuit board 10b, the curve of the metal plates 30a, 30b, 32a and 32b is unlikely to exert influence on the surrounding circuits.

When the circuit board 10b is used, the connecting area A3 is bent as illustrated in FIG. 17. The curve around the border between the base area A1 and the connecting area A3 of the circuit board 10b is similar to the curve around the border between the base area A1 and the connecting area A3 of the circuit board 10a, and a description of the curve is omitted here. The curve around the border between the base area A2 and the connecting area A3 of the circuit board 10b is similar to the curve around the border between the base area A2 and the connecting area A3 of the circuit board 10a, and a description of the curve is omitted here.

The circuit board 10b having the structure above has the same effects as the circuit board 10a.

Third Modification

Figure 18:
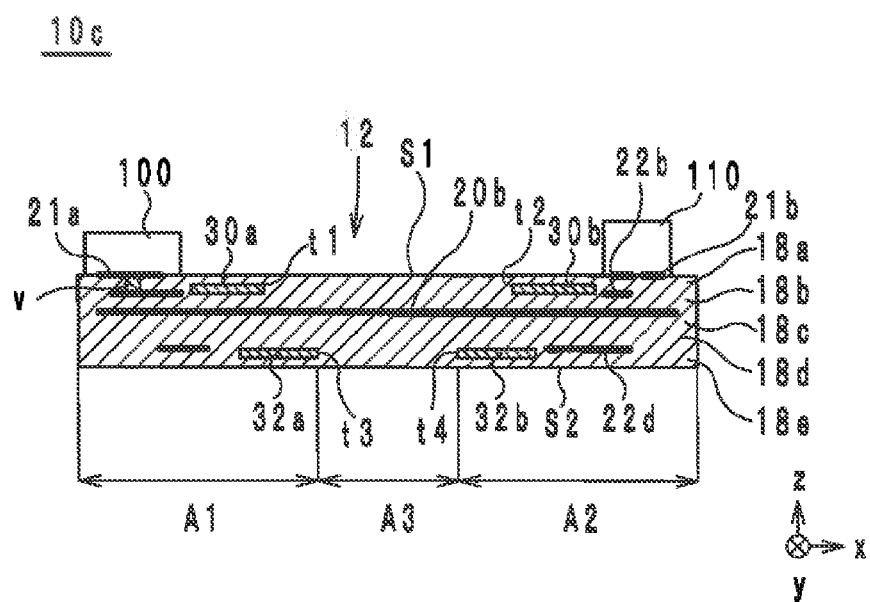
FIG. 18 is a sectional view of a circuit board according to a third modification of a preferred embodiment of the present invention.
Figure 19:
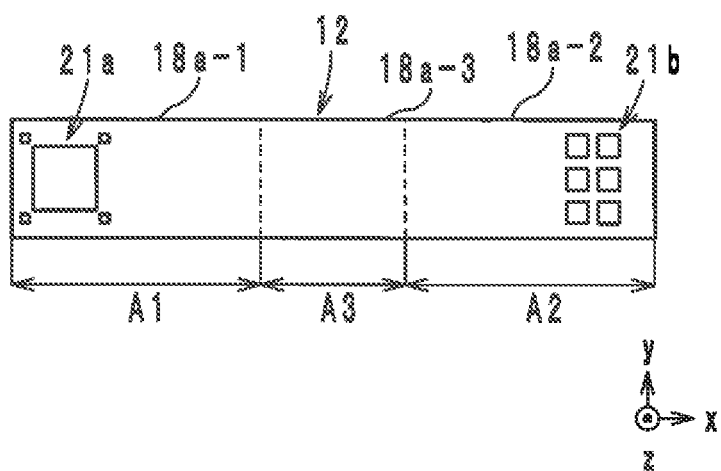
FIG. 19 is a plan view of a dielectric body of the circuit board illustrated in FIG. 18.
Figure 20:
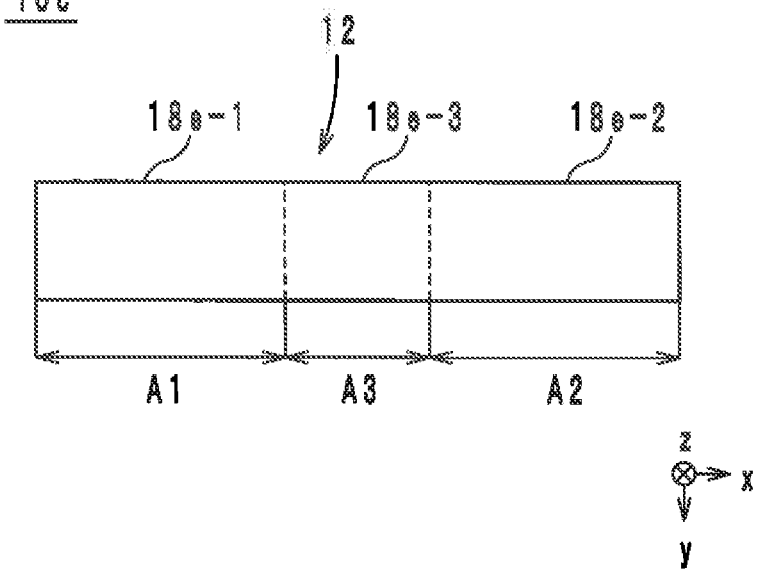
FIG. 20 is a plan view of the dielectric body of the circuit board illustrated in FIG. 18.
Figure 22:
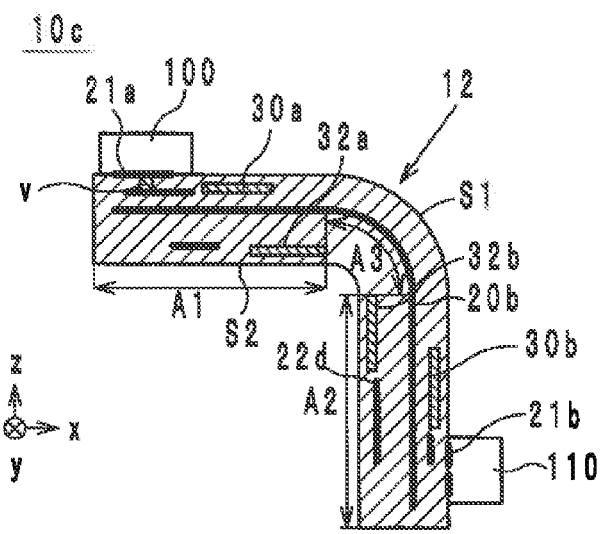
FIG. 22 is a sectional view of the circuit board of FIG. 18 in a bent state.
Figure 23:
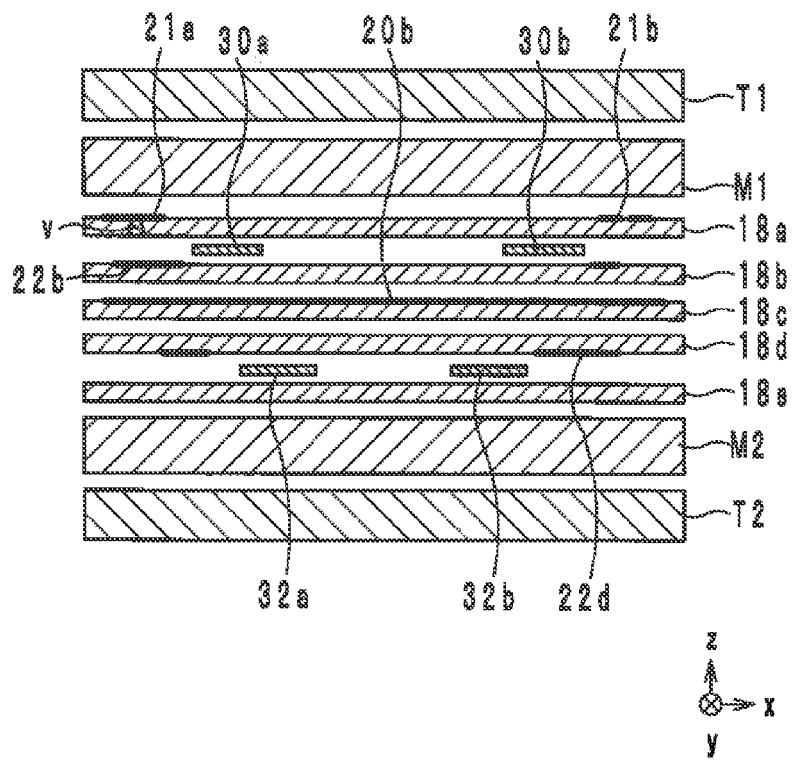
FIG. 23 is a sectional view illustrating a pressure-bonding process to form the dielectric body of the circuit board.

A circuit board 10c according to a third modification of a preferred embodiment of the present invention is described with reference to the drawings. FIG. 18 is a sectional view of the circuit board 10c according to the third modification. FIGS. 19 and 20 are plan views of the dielectric body 12 of the circuit board 10c illustrated in FIG. 18. FIG. 21 is an exploded view of the dielectric body 12 of the circuit board 10c illustrated in FIG. 18. FIG. 22 is a sectional view of the circuit board 10c in a bent state. FIG. 23 is a sectional view illustrating a pressure-bonding process to form the dielectric body 12 of the circuit board 10c.

The circuit board 10c is different from the circuit board 10b in that the dielectric sheets 18a through 18e are laminated together almost wholly in the circuit board 10c and in that the metal plates 30a, 30b, 32a and 32b are embedded in the dielectric body 12. The following description of the circuit board 10c is focused on the differences.

As illustrated in FIGS. 18 and 21, the dielectric body 12 is a laminate of dielectric sheets 18a through 18e. When viewed from the z-direction, the dielectric sheets 18a through 18e have the same shape as the dielectric body 12. The signal lines 20a through 20c, the external terminals 21a and 21b, and the circuit conductors 22b and 22d of the circuit board 10c are the same as the signal lines 20a through 20c, the external terminals 21a and 21b, and the circuit conductors 22b and 22d of the circuit board 10, and descriptions of these elements are omitted here.

The metal plate 32a is located in the base area A1, nearer the back surface S2 in relation to the center of the connecting area A3 in the z-direction. The shorter side of the metal plate 32a extending in the y-direction at the positive end in the x-direction is located on the border of the base area A1 with the connecting area A3. The metal plate 30a is located in the base area A1, nearer the front surface S1 in relation to the center of the connecting area A3 in the z-direction. The shorter side of the metal plate 30a extending in the y-direction at the positive end in the x-direction is spaced away from the connecting area A3 and located farther in the negative x-direction than the shorter side of the metal plate 32a extending in the y-direction at the positive end in the x-direction.

The metal plate 32b is located in the base area A2, nearer the back surface S2 in relation to the center of the connecting area A3 in the z-direction. The shorter side of the metal plate 32b extending in the y-direction at the negative end in the x-direction is located on the border of the base area A2 with the connecting area A3. The metal plate 30b is located in the base area A2, nearer the front surface S1 in relation to the center of the connecting area A3 in the z-direction. The shorter side of the metal plate 30b extending in the y-direction at the negative end in the x-direction is spaced away from the connecting area A3 and located farther in the positive x-direction than the shorter side of the metal plate 32b extending in the y-direction at the negative end in the x-direction.

When the circuit board 10c is used, the connecting area A3 is bent as illustrated in FIG. 22. The curve around the border between the base area A1 and the connecting area A3 of the circuit board 10c is similar to the curve around the border between the base area A1 and the connecting area A3 of the circuit board 10b, and a description of the curve is omitted here. The curve around the border between the base area A2 and the connecting area A3 of the circuit board 10c is similar to the curve around the border between the base area A2 and the connecting area A3 of the circuit board 10b, and a description of the curve is omitted here.

In manufacturing the circuit board 10c, as illustrated in FIG. 23, the metal plates 30a, 30b, 32a and 32b are implanted in the dielectric body 12 in a pressure-bonding process to form the dielectric body 12. Specifically, the metal plates 30a and 30b are placed between the dielectric sheets 18a and 18b, and the metal plates 32a and 32b are placed between the dielectric sheets 18d and 18e. The dielectric sheets 18a through 18e with the metal plates 30a, 30b, 32a and 32b placed inside are pressure-bonded together by use of the cushions M1 and M2 and the dies T1 and T2, whereby the dielectric body 12 is formed. The other steps to manufacture the circuit board 10c are similar to those to manufacture the circuit board 10, and descriptions of the steps are omitted here.

The circuit board 10c having the structure above has the same effects as the circuit board 10b.

In manufacturing the circuit board 10c, the metal plates 30a, 30b, 32a and 32b are implanted in the dielectric body 12 in the pressure-bonding process to form the dielectric body 12, and it is not necessary to stick the metal plates 30a, 30b, 32a and 32b to the dielectric body 12 after the pressure-bonding process.

Fourth Modification

Figure 26:
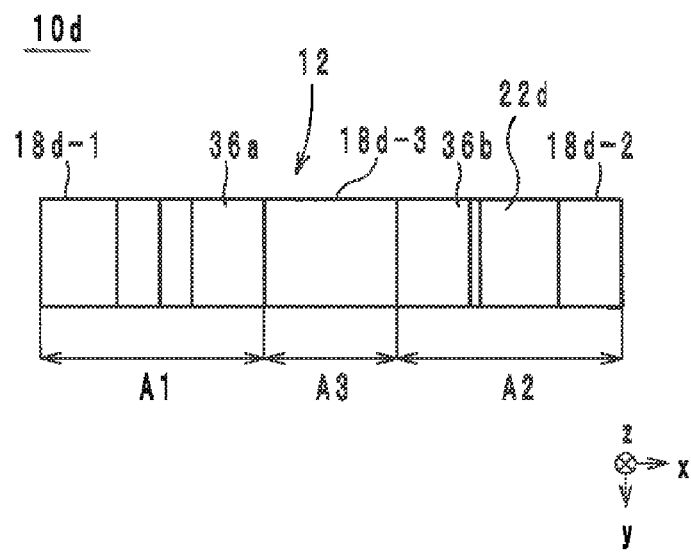
FIG. 26 is a plan view of the dielectric body of the circuit board illustrated in FIG. 24.
Figure 27:
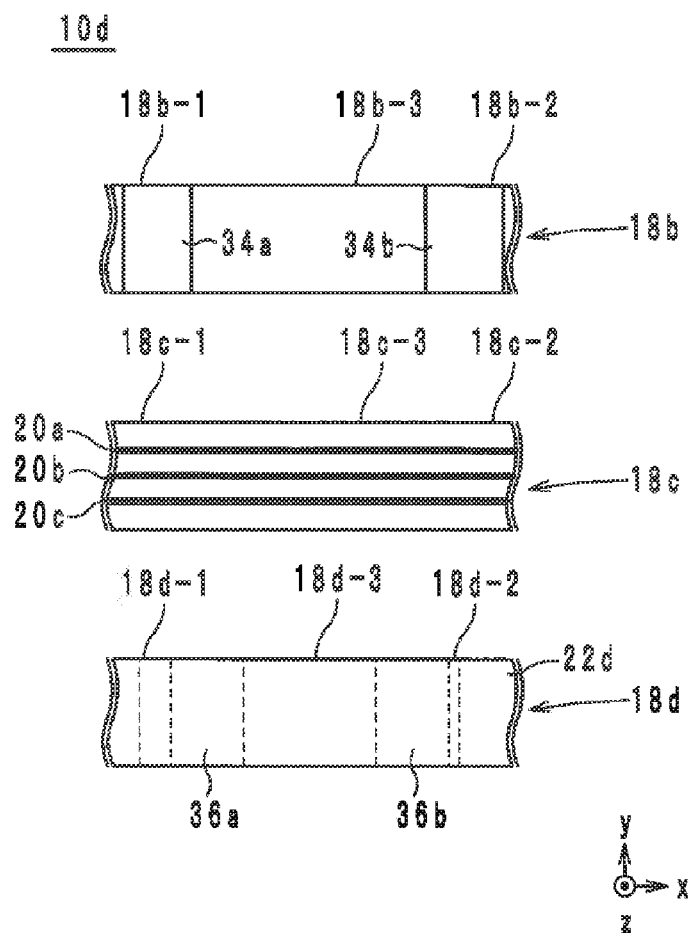
FIG. 27 is an exploded view of the dielectric body of the circuit board illustrated in FIG. 24.
Figure 28:
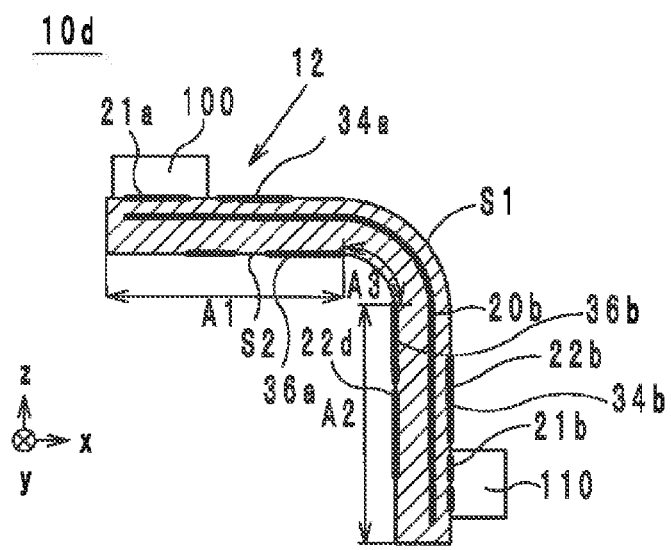
FIG. 28 is a sectional view of the circuit board of FIG. 24 in a bent state.

A circuit board 10d according to a fourth modification of a preferred embodiment of the present invention is described with reference to the drawings. FIG. 24 is a sectional view of the circuit board 10d according to the fourth modification. FIGS. 25 and 26 are plan views of the dielectric body 12 of the circuit board 10d illustrated in FIG. 24. FIG. 27 is an exploded view of the dielectric body 12 of the circuit board 10d illustrated in FIG. 24. FIG. 28 is a sectional view of the circuit board 10d in a bent state.

The circuit board 10d is different from the circuit board 10b in that reinforcing conductors 34a, 34b, 36a and 36b are provided instead of the metal plates 30a, 30b, 32a and 32b. The following description of the circuit board 10d is focused on the difference.

The reinforcing conductor 36a is a conductor, for example, provided on the back surface of the dielectric sheet 18d so as to be located on the back surface S2 of the base area A1 as seen in FIGS. 24, 26 and 27. The short side of the reinforcing conductor 36a extending in the y-direction at the positive end in the x-direction is located on the border of the base area A1 with the connecting area A3.

The reinforcing conductor 34a is a conductor, for example, provided on the front surface of the dielectric sheet 18b so as to be located on the front surface S1 of the base area A1. As seen in FIGS. 24, 25 and 27, the short side of the reinforcing conductor 34a extending in the y-direction at the positive end in the x-direction is spaced away from the connecting area A3 and located farther in the negative x-direction than the short side of the reinforcing conductor 36a extending in the y-direction at the positive end in the x-direction.

The reinforcing conductor 36b is a conductor, for example, provided on the back surface of the dielectric sheet 18d so as to be located on the back surface S2 of the base area A2 as seen in FIGS. 24, 26 and 27. The short side of the reinforcing conductor 36b extending in the y-direction at the negative end in the x-direction is located on the border of the base area A2 with the connecting area A3.

The reinforcing conductor 34b is a conductor, for example, provided on the front surface of the dielectric sheet 18b so as to be located on the front surface S1 of the base area A2. As seen in FIGS. 24, 25 and 27, the short side of the reinforcing conductor 34b extending in the y-direction at the negative end in the x-direction is spaced away from the connecting area A3 and located farther in the positive x-direction than the short side of the reinforcing conductor 36b extending in the y-direction at the negative end in the x-direction.

The reinforcing conductors 34a, 34b, 36a and 36b are not connected to any other circuit conductors. Accordingly, the potential of the reinforcing conductors 34a, 34b, 36a and 36b becomes a floating potential when the circuit board 10d is used. The floating potential is a potential between the ground potential and the potential of the signal lines 20a through 20c.

When the circuit board 10d is used, the connecting area A3 is bent as illustrated in FIG. 28. The curve of the circuit board 10d around the border between the base area A1 and the connecting area A3 is similar to the curve of the circuit board 10b around the border between the base area A1 and the connecting area A3, and a description of the curve is omitted here. The curve of the circuit board 10d around the border between the base area A2 and the connecting area A3 is similar to the curve of the circuit board 10b around the border between the base area A2 and the connecting area A3, and a description of the curve is omitted here.

The circuit board 10d having the structure above has the same effects as the circuit board 10b.

Fifth Modification

Figure 29:
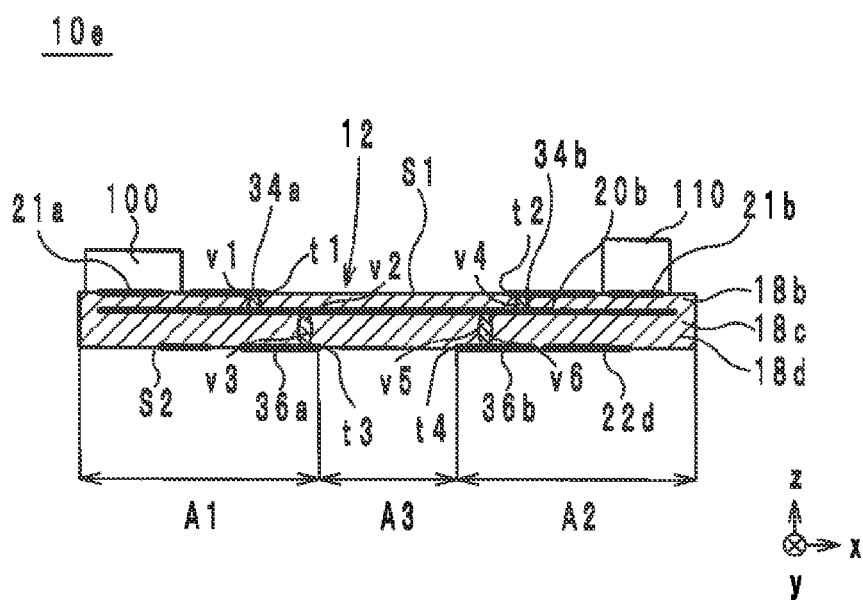
FIG. 29 is a sectional view of a circuit board according to a fifth modification of a preferred embodiment of the present invention.
Figure 30:
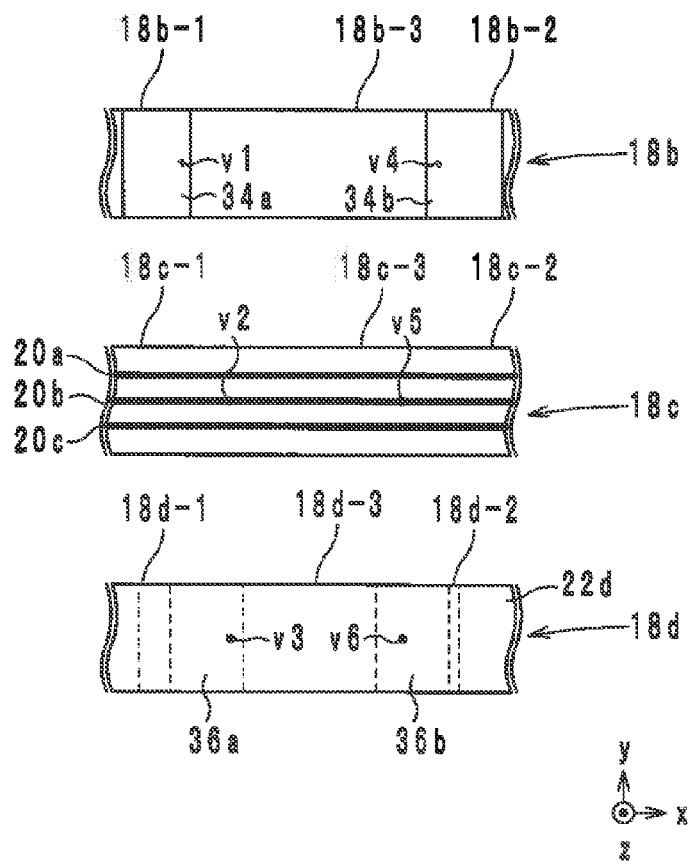
FIG. 30 is an exploded view of the dielectric body of the circuit board illustrated in FIG. 29.
Figure 31:
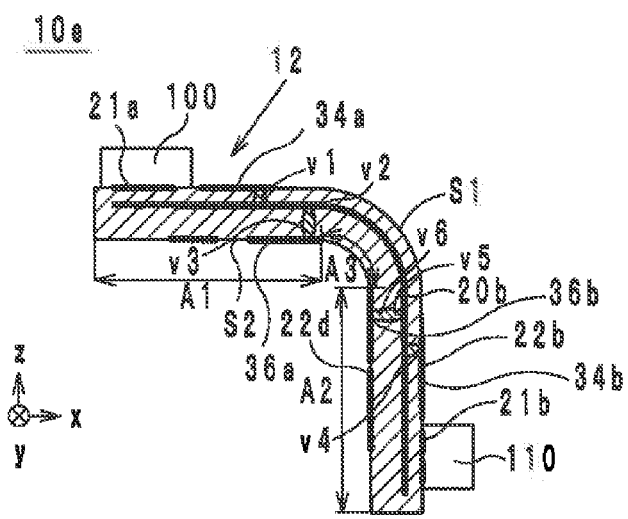
FIG. 31 is a sectional view of the circuit board of FIG. 29 in a bent state.
Figure 32:
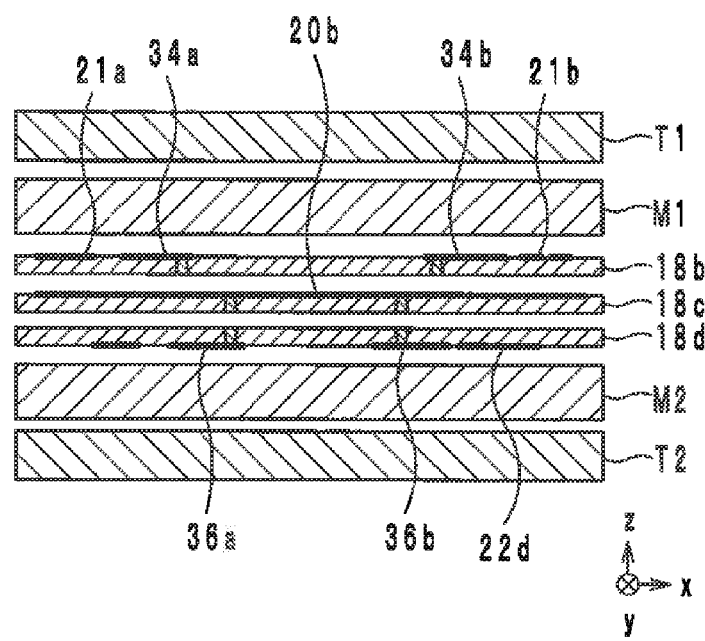
FIG. 32 is a sectional view illustrating a pressure-bonding process to form the dielectric body of the circuit board.

A circuit board 10e according to a fifth modification of a preferred embodiment of the present invention is described with reference to the drawings. FIG. 29 is a sectional view of the circuit board 10e according to the fifth modification. FIG. 30 is an exploded view of the dielectric body 12 of the circuit board 10e illustrated in FIG. 29. FIG. 31 is a sectional view of the circuit board 10e in a bent state. FIG. 32 is a sectional view illustrating a pressure-bonding process to form the dielectric body 12 of the circuit board 10e.

The circuit board 10e is different from the circuit board 10d in that via-hole conductors v1 through v6 are further provided. The following description of the circuit board 10e is focused on the difference.

As seen in FIGS. 29 and 30, the via-hole conductor v1 is pierced in the dielectric sheet 18b in the z-direction so as to connect the reinforcing conductor 34a to the signal line 20b. The via-hole conductor v2 is pierced in the dielectric sheet 18c in the z-direction, and the via-hole conductor v3 is pierced in the dielectric sheet 18d in the z-direction. The via-hole conductors v2 and v3 are connected to each other to define one via-hole conductor. The via-hole conductors v2 and v3 connect the signal line 20b to the reinforcing conductor 36a.

As seen in FIGS. 29 and 30, the via-hole conductor v4 is pierced in the dielectric sheet 18b in the z-direction so as to connect the reinforcing conductor 34b to the signal line 20b. The via-hole conductor v5 is pierced in the dielectric sheet 18c in the z-direction, and the via-hole conductor v6 is pierced in the dielectric sheet 18d in the z-direction. The via-hole conductors v5 and v6 are connected to each other to define one via-hole conductor. The via-hole conductors v5 and v6 connect the signal line 20b to the reinforcing conductor 36b.

When the circuit board 10e is used, the connecting area A3 is bent as illustrated in FIG. 31. The curve of the circuit board 10e around the border between the base area A1 and the connecting area A3 is similar to the curve of the circuit board 10d around the border between the base area A1 and the connecting area A3, and a description of the curve is omitted here. The curve of the circuit board 10e around the border between the base area A2 and the connecting area A3 is similar to the curve of the circuit board 10d around the border between the base area A2 and the connecting area A3, and a description of the curve is omitted here.

In manufacturing the circuit board 10e, as illustrated in FIG. 32, in a pressure-bonding process to form the dielectric body 12, the dielectric sheets 18b through 18d are laminated such that the external terminals 21a and 21b and the reinforcing conductors 34a and 34b are located on the front surface of the dielectric sheet 18b, such that the signal lines 20a through 20c are located on the front surface of the dielectric sheet 18c and such that the reinforcing conductors 36a and 36b are located on the back surface of the dielectric sheet 18d. The dielectric sheets 18b through 18d are pressure-bonded by use of the cushions M1 and M2 and the dies T1 and T2, such that the dielectric body 12 is formed. The other steps to manufacture the circuit board 10e are similar to those of the circuit board 10d, and descriptions of the steps are omitted here.

The circuit board 10e having the structure above has the same effects as the circuit board 10d.

In the circuit board 10e, the via-hole conductors v1 through v3 are provided in the base area A1, and the via-hole conductors v4 through v6 are provided in the base area A2. The via-hole conductors v1 through v6 are harder than the dielectric sheets 18b through 18d. Therefore, since the via-hole conductors v1 through v3 are provided in the base area A1, the base area A1 is less likely to bend. Since the via-hole conductors v4 through v6 are provided in the base area A2, the base area A2 is less likely to bend. Consequently, it becomes less likely that deformation of the base areas A1 and A2 is caused by the bending of the connecting area A3. Thus, variations in the bent position of the dielectric body 12 are prevented. Accordingly, variations in the characteristics of the signal lines 20a through 20c are prevented.

Sixth Modification

Figure 33:
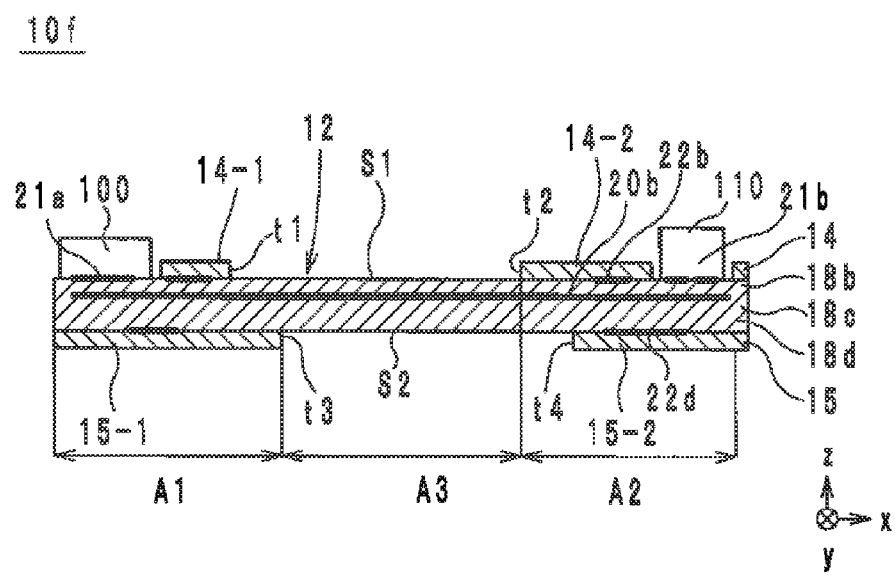
FIG. 33 is a sectional view of a circuit board according to a sixth modification of a preferred embodiment of the present invention.
Figure 34:
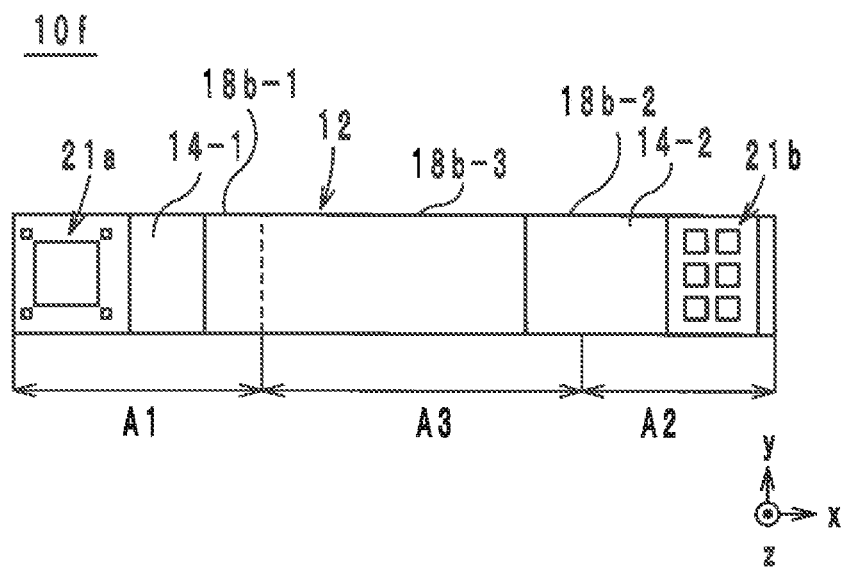
FIG. 34 is a plan view of a dielectric body of the circuit board illustrated in FIG. 33.
Figure 35:
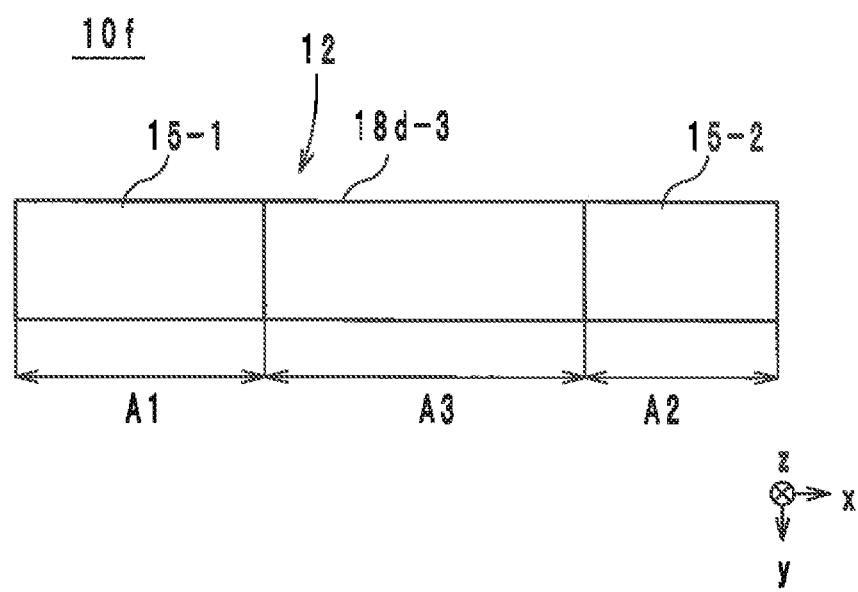
FIG. 35 is a plan view of the dielectric body of the circuit board illustrated in FIG. 33.
Figure 36:
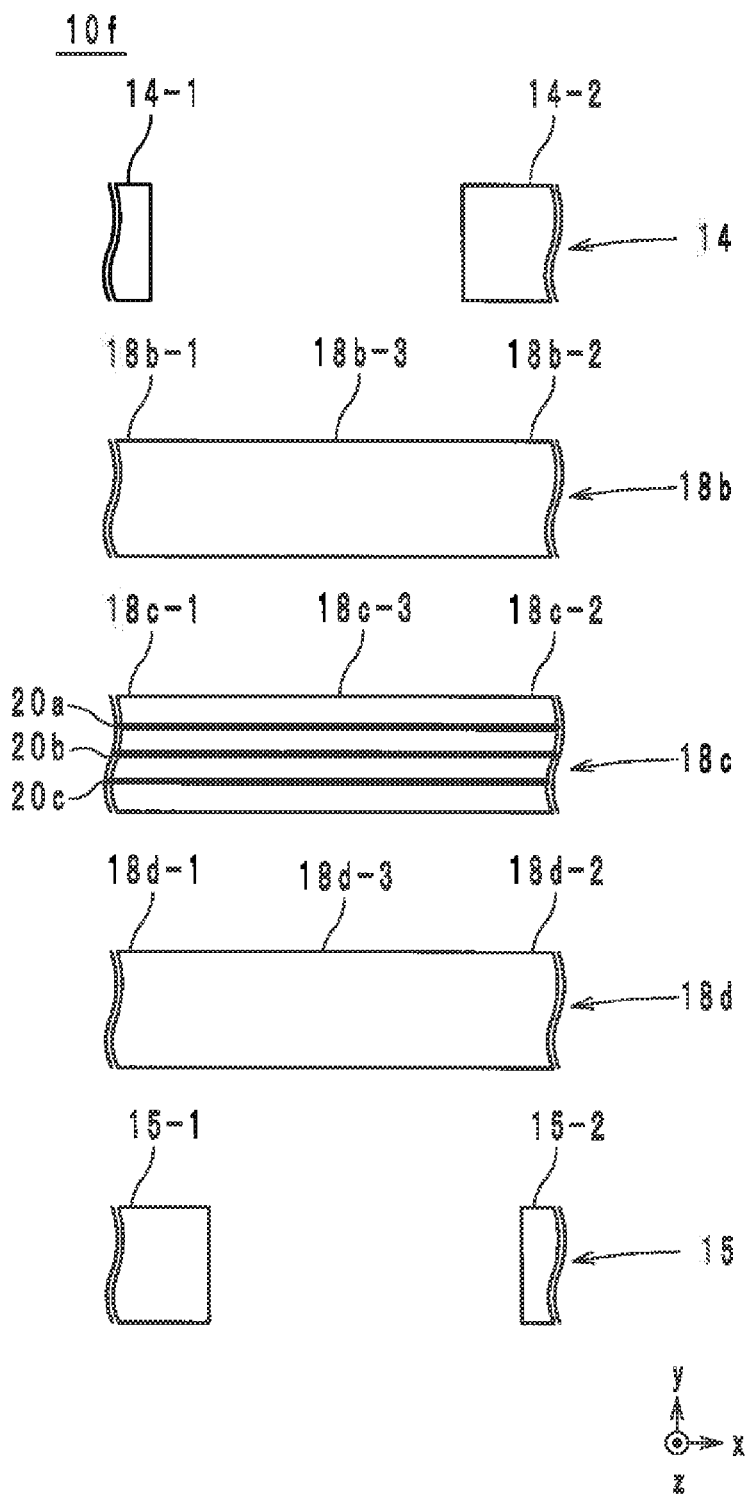
FIG. 36 is an exploded view of the dielectric body of the circuit board illustrated in FIG. 33.

A circuit board 10f according to a sixth modification of a preferred embodiment of the present invention is described with reference to the drawings. FIG. 33 is a sectional view of the circuit board 10f according to the sixth modification. FIGS. 34 and 35 are plan views of the dielectric body 12 of the circuit board 10f illustrated in FIG. 33. FIG. 36 is an exploded view of the dielectric body 12 of the circuit board 10f illustrated in FIG. 33. FIG. 37A is a sectional view of the circuit board 10f in a bent state.

The circuit board 10f is different from the circuit board 10a in the shapes of the protective layers 14 and 15 and in the form of bending the connecting area A3. The following description of the circuit board 10f is focused on the differences.

The protective layer 14 is, for example, a resist layer formed of resin and covers the circuit conductors 22b provided on the dielectric body 12. The protective layer 14 is a portion of the dielectric body 12, and includes base portions 14-1 and 14-2. The base portions 14-1 and 14-2 are placed at the most positive sides in the z-direction of the base areas A1 and A2 respectively. However, the base portions 14-1 and 14-2 of the protective layer 14 are not provided around the external terminals 21a and 21b so that the external terminals 21a and 21b are exposed. Thus, the front surface of the protective layer 14 defines portions of the front surface S1 of the dielectric body 12.

The protective layer 15 is, for example, a resist layer formed of resin. The protective layer 15 is a portion of the dielectric body 12, and includes base portions 15-1 and 15-2. The base portions 15-1 and 15-2 are placed at the most negative sides in the z-direction of the base areas A1 and A2 respectively. Thus, the back surface of the protective layer 15 defines portions of the back surface S2 of the dielectric body 12.

The base portions 14-1 and 15-1, as seen in FIGS. 33 through 36, define and function as reinforcing members. The locations of the base portions 14-1 and 15-1 in the circuit board 10f are the same as the locations of the base portions 14-1 and 15-1 in the circuit board 10a. Specifically, the short side of the base portion 15-1 extending in the y-direction at the positive end in the x-direction is located on the border of the base area A1 with the connecting area A3. The short side of the base portion 14-1 extending in the y-direction at the positive end in the x-direction is spaced away from the connecting area A3 and located farther in the negative x-direction than the short side of the base portion 15-1 extending in the y-direction at the positive end in the x-direction.

The base portions 14-2 and 15-2, as seen in FIGS. 33 through 36, define and function as reinforcing members. The locations of the base portions 14-2 and 15-2 in the circuit board 10f are different from the locations of the base portions 14-2 and 15-2 in the circuit board 10a. Specifically, the short side of the base portion 14-2 extending in the y-direction at the negative end in the x-direction is located on the border of the base area A2 with the connecting area A3. The short side of the base portion 15-2 extending in the y-direction at the negative end in the x-direction is spaced away from the connecting area A3 and located farther in the positive x-direction than the short side of the base portion 14-2 extending in the y-direction at the negative end in the x-direction.

When the circuit board 10f is used, the connecting area A3 is bent into an S shape as illustrated in FIG. 37A. Specifically, the negative-side portion in the x-direction of the connecting area A3 in relation to the center in the x-direction is curved such that the front surface S1 and the back surface S2 become the outer side and the inner side respectively. On the other hand, the positive-side portion in the x-direction of the connecting area A3 in relation to the center in the x-direction is curved such that the back surface S2 and the front surface S1 become the outer side and the inner side, respectively.

The curve of the circuit board 10f around the border between the base area A1 and the connecting area A3 is similar to the curve of the circuit board 10a around the border between the base area A1 and the connecting area A3, and a description of the curve is omitted here.

The curve of the circuit board 10f around the border between the base area A2 and the connecting area A3 is described below. When the connecting area A3 of the dielectric body 12 is bent into an S shape, the back surface S2 curves from the portion overlapping the edge t4 in the z-direction as illustrated in FIG. 37A. However, the curvature of the back surface S2 in the portion from the border between the base area A2 and the connecting area A3 to the edge t4 of the base portion 15-2 is smaller than the curvature of the back surface S2 in the connecting area A3.

Unlike the back surface S2 in the portion from the border between the base area A2 and the connecting area A3 to the edge t4 of the base portion 15-2, the front surface S1 in the portion from the border between the base area A2 and the connecting area A3 to the edge t4 of the base portion 15-2 does not curve. Thus, the front surface S1 curves from the portion overlapping the edge t2 in the z-direction.

The circuit board 10f having the structure above has the same effects as the circuit board 10a.

Seventh Modification

Figure 37B:
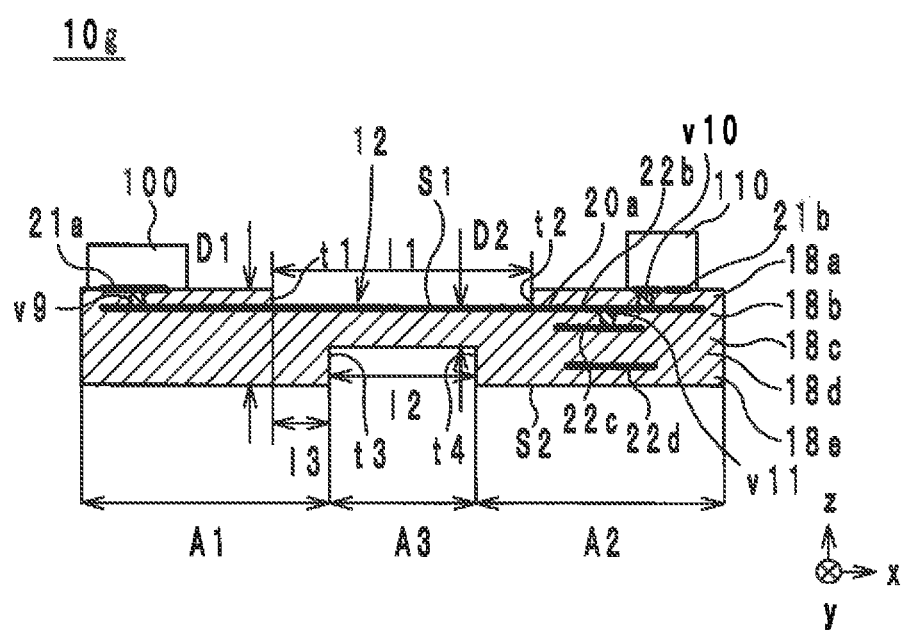
FIG. 37B is a sectional view of a circuit board according to a seventh modification of a preferred embodiment of the present invention.
Figure 37C:
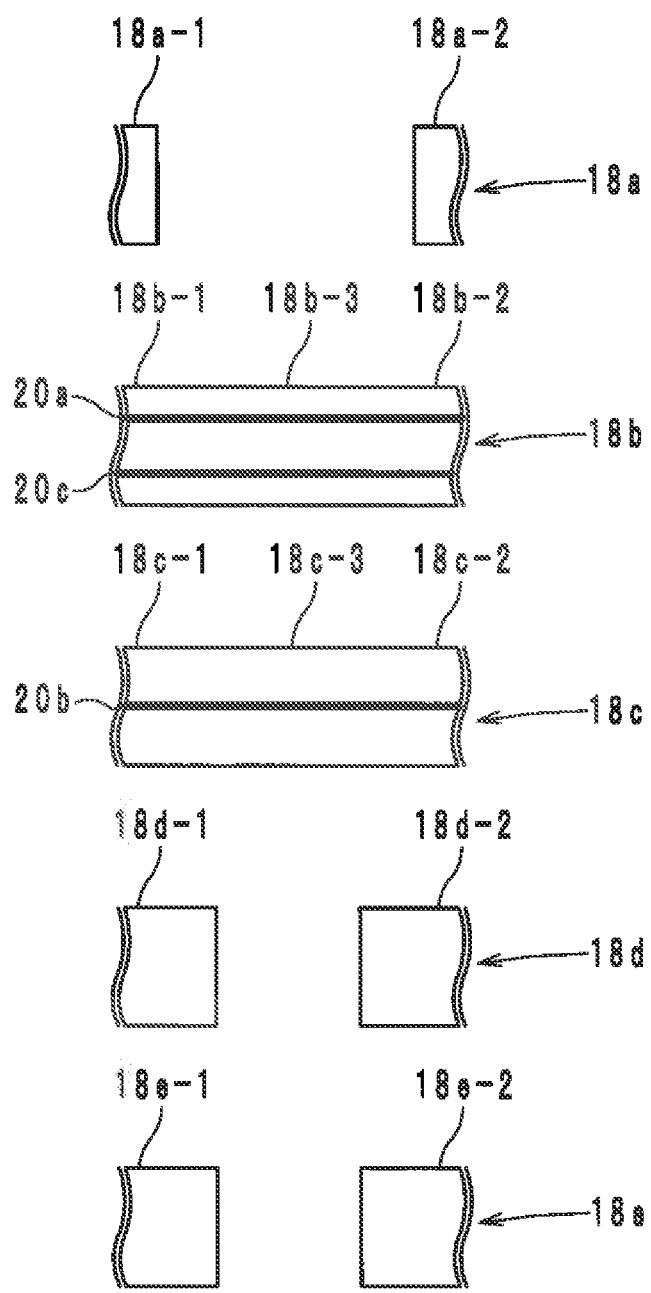
FIG. 37C is an exploded view of the dielectric body of the circuit board illustrated in FIG. 37B.
Figure 37D:
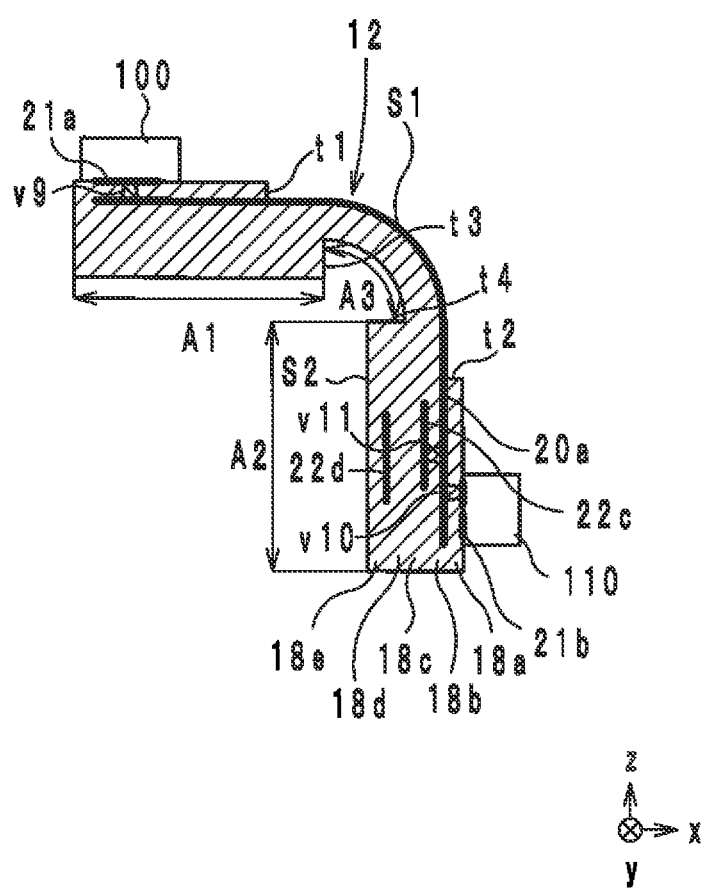
FIG. 37D is a sectional view of the circuit board of FIG. 37B in a bent state.
Figure 38:
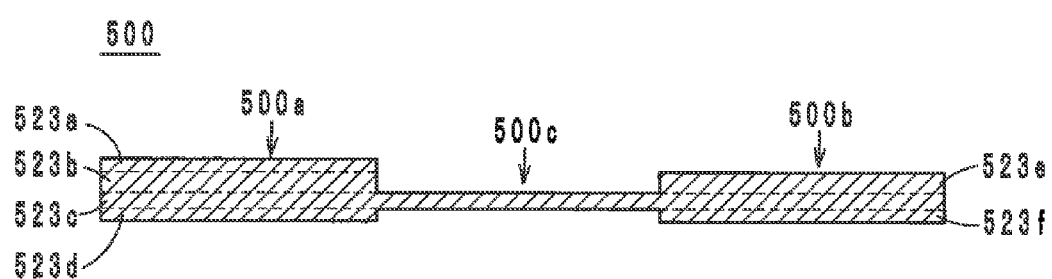
FIG. 38 is a sectional view of a printed circuit board disclosed in Japanese Patent Laid-Open Publication No. 2002-305382.
Figure 39:
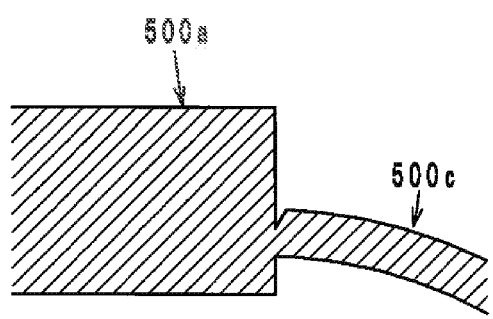
FIG. 39 is a sectional view of the printed circuit board of Japanese Patent Laid-Open Publication No. 2002-305382 in a bent state.

A circuit board 10g according to a seventh modification of a preferred embodiment of the present invention is described with reference to the drawings. FIG. 37B is a sectional view of the circuit board 10g according to the seventh modification. FIG. 37C is an exploded view of the dielectric body 12 of the circuit board 10g illustrated in FIG. 37B. FIG. 37D is a sectional view of the circuit board 37g in a bent state.

The circuit board 10g is different from the circuit board 10 in the positions of the signal lines 20a and 20c and in the existence or non-existence of via-hole conductors v9 through v11. The following description of the circuit board 10g is focused on the differences.

In the circuit board 10g, the signal lines 20a and 20c are provided on the front surface of the dielectric sheet 18b.

As seen in FIG. 37B, the via-hole conductors v9 are interlayer connection conductors pierced in the base portion 18a-1 in the z-direction so as to connect the external terminal 21a to the signal line 20a. The via-hole conductors v9 are preferably formed by making through holes piercing the base portion 18a-1 in the z-direction and by filling the through holes with a conductive paste. Each of the via-hole conductors v9 is preferably configured such that the diameter of the negative end in the z-direction is greater than the diameter of the positive end in the z-direction. Accordingly, the thicker ends of the via-hole conductors v9 contact with the signal line 20a.

As seen in FIG. 37B, the via-hole conductors v10 are interlayer connection conductors pierced in the base portion 18a-2 in the z-direction so as to connect the external terminal 21b to the signal line 20a. The via-hole conductors v10 are preferably formed by making through holes piercing the base portion 18b-1 in the z-direction and by filling the through holes with a conductive paste. Each of the via-hole conductor v10 is preferably configured such that the diameter of the negative end in the z-direction is greater than the diameter of the positive end in the z-direction. Accordingly, the thicker ends of the via-hole conductors v10 contact with the signal line 20a.

As seen in FIG. 37B, the via-hole conductors v11 are interlayer connection conductors pierced in the base portion 18b-2 in the z-direction so as to connect a circuit conductor 22c to the signal line 20a. The via-hole conductors v11 are preferably formed by making through holes piercing the base portion 18b-2 in the z-direction and by filling the through hole with a conductive paste. Each of the via-hole conductors v11 is preferably configured such that the diameter of the positive end in the z-direction is greater than the diameter of the negative end in the z-direction. Accordingly, the thicker ends of the via-hole conductors v11 contact with the signal line 20a.

As described above, in the circuit board 10g, with regard to the via-hole conductors v9 and v10 that contact with the signal line 20a from the positive side in the z-direction, the negative ends in the z-direction are thicker than the positive ends in the z-direction. With regard to the via-hole conductors v11 that contact with the signal line 20a from the negative side in the z-direction, the positive ends in the z-direction are thicker than the negative ends in the z-direction.

When the circuit board 10 g having the structure above is used, the connecting area A3 is bent as illustrated in FIG. 37D. As the circuit board 10, the circuit board 10 g significantly reduces or eliminates the risk of damage to the dielectric body 12.

Also, as the circuit board 10, the circuit board 10 g prevents disconnection between each of the via-hole conductors v9 through v11 and the signal line 20a.

The via-hole conductors v9 through v11 are not necessarily connected to the signal line 20a and may be connected to any other conductor that extends across the base area A1 and the connecting area A3 or across the base area A2 and the connecting area A3.

Other Preferred Embodiments

Circuit boards according to preferred embodiments of the present invention are not limited to the circuit boards 10 and 10a through 10g above, and various changes and modifications are possible within the scope of the present invention.

In each of the circuit boards 10 and 10a through 10g, instead of the integrated circuit 100, a connector may be mounted. Each of the circuit boards 10 and 10a through 10g may include one or more ground conductors extending along the signal lines 20a through 20c, thus defining and functioning as a high-frequency signal line to transmit high-frequency signals. Each of the circuit boards 10 and 10a through 10g may be used as a high-frequency signal line in an RF circuit board such as an antenna front-end module.

Also, the signal lines 20a through 20c may be signal lines used as an antenna line, a power line, etc.

The circuit board does not always require two or more signal lines and may include only one signal line. Alternatively, the circuit board may have no signal lines.

In the above-described manufacturing method of the circuit boards 10 and 10a through 10g, the cushions M1 and M2 are preferably used in the pressure-bonding process. However, it is not always necessary to use the cushions M1 and M2. For example, a mold having a shape corresponding to the outer shape of the circuit board may be used in the pressure-bonding process.

Each of the circuit boards 10 and 10a through 10g may be connected to another circuit board not via the connector 110. It is possible to connect each of the circuit boards 10 and 10a through 10g to another circuit board by soldering the another circuit board to external terminals provided on the base areas A1 and A2.

It is possible to combine the structures of the circuit boards 10 and 10a through 10g in any appropriate way.

As thus far described, preferred embodiments of the present invention are useful in a circuit board, and preferred embodiments of the present invention significantly reduce or eliminate the risk of damage to a dielectric body caused in bending of the dielectric body.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit board comprising:
a plate-shaped dielectric body including a first main surface and a second main surface, the plate-shaped dielectric body including a first area that is not bent when the circuit board is used and a second area that is bent such that the first main surface and the second main surface become an outer side and an inner side, respectively, when the circuit board is used;
a first reinforcing member located in the first area of the dielectric body, nearer the first main surface in relation to a center of the second area of the dielectric body in a thickness direction; and
a second reinforcing member located in the first area of the dielectric body, nearer the second main surface in relation to the center of the second area of the dielectric body in the thickness direction, and contacting with a border between the first area and the second area; wherein
the first reinforcing member is located farther away from the second area than the second reinforcing member;
when the circuit board is used, the first main surface of the dielectric body curves from a portion overlapping a first edge of the first reinforcing member closest to the second area when viewed from a direction normal to the first main surface;
when the circuit board is used, the second main surface of the dielectric body curves from a portion overlapping a second edge of the second reinforcing member on the border between the first area and the second area when viewed from a direction normal to the second main surface; and
the first reinforcing member and the second reinforcing member are metal plates.

2. The circuit board according to claim 1, wherein
the first reinforcing member is located on the first main surface; and
the second reinforcing member is located on the second main surface.

3. The circuit board according to claim 1, wherein the first reinforcing member and the second reinforcing member are embedded in the dielectric body.

4. The circuit board according to claim 1, wherein the first reinforcing member and the second reinforcing member are not connected any other conductors.

5. The circuit board according to claim 1, further comprising a second conductor provided in the dielectric body to extend across the first area and the second area.

6. The circuit board according to claim 5, further comprising a via-hole conductor connected to the second conductor; wherein
a diameter of a first end of the via-hole conductor is greater than a diameter of a second end of the via-hole conductor; and
the first end of the via-hole conductor contacts with the second conductor.

7. The circuit board according to claim 6, wherein the second conductor is a linear signal line.

8. A circuit board comprising:
a plate-shaped dielectric body including a first main surface and a second main surface, the plate-shaped dielectric body including a first area that is not bent when the circuit board is used and a second area that is bent such that the first main surface and the second main surface become an outer side and an inner side, respectively, when the circuit board is used;
a first reinforcing member located in the first area of the dielectric body, nearer the first main surface in relation to a center of the second area of the dielectric body in a thickness direction;
a second reinforcing member located in the first area of the dielectric body, nearer the second main surface in relation to the center of the second area of the dielectric body in the thickness direction, and contacting with a border between the first area and the second area; and
a first conductor provided at the dielectric body; wherein
the first reinforcing member is located farther away from the second area than the second reinforcing member;
when the circuit board is used, the first main surface of the dielectric body curves from a portion overlapping a first edge of the first reinforcing member closest to the second area when viewed from a direction normal to the first main surface;
when the circuit board is used, the second main surface of the dielectric body curves from a portion overlapping a second edge of the second reinforcing member on the border between the first area and the second area when viewed from a direction normal to the second main surface; and
the first reinforcing member and the second reinforcing member are portions of the first conductor and are not connected to any other conductors.

9. The circuit board according to claim 8, wherein
the first reinforcing member is located on the first main surface; and
the second reinforcing member is located on the second main surface.

10. The circuit board according to claim 8, wherein the first reinforcing member and the second reinforcing member are embedded in the dielectric body.

11. The circuit board according to claim 8, further comprising a second conductor provided in the dielectric body to extend across the first area and the second area.

12. The circuit board according to claim 11, further comprising a via-hole conductor connected to the second conductor; wherein
a diameter of a first end of the via-hole conductor is greater than a diameter of a second end of the via-hole conductor; and
the first end of the via-hole conductor contacts with the second conductor.

13. The circuit board according to claim 12, wherein the second conductor is a linear signal line.

14. The circuit board according to claim 13, wherein the second conductor is a linear signal line.

* * * * *